(12) United States Patent
Khazeni et al.

(10) Patent No.: US 8,941,631 B2
(45) Date of Patent: Jan. 27, 2015

(54) SIMULTANEOUS LIGHT COLLECTION AND ILLUMINATION ON AN ACTIVE DISPLAY

(75) Inventors: Kasra Khazeni, San Jose, CA (US); Manish Kothari, Cupertino, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 383 days.

(21) Appl. No.: 12/271,694

(22) Filed: Nov. 14, 2008

(65) Prior Publication Data

US 2009/0126777 A1    May 21, 2009

Related U.S. Application Data

(63) Continuation-in-part of application No. 11/941,851, filed on Nov. 16, 2007, now abandoned.

(60) Provisional application No. 61/093,686, filed on Sep. 2, 2008.

(51) Int. Cl.
| | | |
|---|---|---|
| G09F 13/08 | (2006.01) | |
| G02B 26/00 | (2006.01) | |
| F21V 8/00 | (2006.01) | |
| G09G 3/20 | (2006.01) | |
| G09G 3/34 | (2006.01) | |
| H01L 31/052 | (2014.01) | |

(52) U.S. Cl.
CPC ............ *G02B 26/001* (2013.01); *G02B 6/0038* (2013.01); *G09G 3/20* (2013.01); *G09G 3/3466* (2013.01); *H01L 31/0522* (2013.01); *G09G 2330/023* (2013.01); *Y02E 10/52* (2013.01)
USPC ........................................... 345/207; 257/59

(58) Field of Classification Search
USPC ...................................... 345/102, 207; 257/59
See application file for complete search history.

(56) References Cited

U.S. PATENT DOCUMENTS

| | | | |
|---|---|---|---|
| 2,590,906 | A | 4/1952 | Tripp |
| 2,677,714 | A | 5/1954 | Auwarter |
| 3,247,392 | A | 4/1966 | Thelen |
| 3,679,313 | A | 7/1972 | Rosenberg |
| 3,728,030 | A | 4/1973 | Hawes |
| 3,886,310 | A | 5/1975 | Guldberg |

(Continued)

FOREIGN PATENT DOCUMENTS

| | | |
|---|---|---|
| CN | 1612013 | 5/2005 |
| CN | 1517743 | 7/2006 |

(Continued)

OTHER PUBLICATIONS

International Search Report dated Mar. 27, 2009 in Application No. PCT/US2008/083678.

(Continued)

*Primary Examiner* — Thomas L Dickey
(74) *Attorney, Agent, or Firm* — Knobbe, Martens, Olson & Bear LLP

(57) ABSTRACT

In various embodiments described herein, a display device comprising a light collection film and a photovoltaic device disposed on an edge of the collection film. The collection film has a plurality of light-turning features for redirecting light between the front and back surface of the collection film and the photovoltaic device. In some embodiments, a light source is also disposed on an edge of the collection film and emits light which is turned by the light-turning features toward the display.

34 Claims, 17 Drawing Sheets

(56) References Cited

U.S. PATENT DOCUMENTS

| | | |
|---|---|---|
| 3,955,190 A | 5/1976 | Teraishi |
| 4,154,219 A | 5/1979 | Gupta et al. |
| 4,403,248 A | 9/1983 | te Velde |
| 4,421,381 A | 12/1983 | Ueda et al. |
| 4,441,789 A | 4/1984 | Pohlack |
| 4,441,791 A | 4/1984 | Hornbeck |
| 4,497,974 A | 2/1985 | Deckman et al. |
| 4,498,953 A | 2/1985 | Cook et al. |
| 4,560,435 A | 12/1985 | Brown et al. |
| 4,655,554 A | 4/1987 | Armitage |
| 4,705,361 A | 11/1987 | Frazier et al. |
| 4,779,959 A | 10/1988 | Saunders |
| 4,786,128 A | 11/1988 | Birnbach |
| 4,822,993 A | 4/1989 | Dillon et al. |
| 4,859,060 A | 8/1989 | Katagiri et al. |
| 4,863,224 A | 9/1989 | Afian et al. |
| 4,925,259 A | 5/1990 | Emmett |
| 4,954,789 A | 9/1990 | Sampsell |
| 4,956,619 A | 9/1990 | Hornbeck |
| 4,973,131 A | 11/1990 | Carnes |
| 5,022,745 A | 6/1991 | Zayhowski et al. |
| 5,028,939 A | 7/1991 | Hornbeck et al. |
| 5,062,689 A | 11/1991 | Koehler |
| 5,091,983 A | 2/1992 | Lukosz |
| 5,096,279 A | 3/1992 | Hornbeck et al. |
| 5,110,370 A | 5/1992 | Vogeli et al. |
| 5,123,247 A | 6/1992 | Nelson |
| 5,170,283 A | 12/1992 | O'Brien et al. |
| 5,261,970 A | 11/1993 | Landis et al. |
| 5,315,370 A | 5/1994 | Bulow |
| 5,381,232 A | 1/1995 | van Wijk |
| 5,452,138 A | 9/1995 | Mignardi et al. |
| 5,471,341 A | 11/1995 | Warde et al. |
| 5,526,172 A | 6/1996 | Kanack |
| 5,550,373 A | 8/1996 | Cole et al. |
| 5,559,358 A | 9/1996 | Burns et al. |
| 5,561,523 A | 10/1996 | Blomberg et al. |
| 5,597,736 A | 1/1997 | Sampsell |
| 5,600,383 A | 2/1997 | Hornbeck |
| 5,636,052 A | 6/1997 | Arney et al. |
| 5,646,729 A | 7/1997 | Koskinen et al. |
| 5,646,768 A | 7/1997 | Kaeiyama |
| 5,661,592 A | 8/1997 | Bornstein et al. |
| 5,665,997 A | 9/1997 | Weaver et al. |
| 5,699,181 A | 12/1997 | Choi |
| 5,710,656 A | 1/1998 | Goossen |
| 5,719,068 A | 2/1998 | Suzawa et al. |
| 5,734,177 A | 3/1998 | Sakamoto |
| 5,771,116 A | 6/1998 | Miller et al. |
| 5,782,993 A | 7/1998 | Ponewash |
| 5,786,927 A | 7/1998 | Greywall et al. |
| 5,808,708 A | 9/1998 | Oyama et al. |
| 5,808,781 A | 9/1998 | Arney et al. |
| 5,818,095 A | 10/1998 | Sampsell |
| 5,825,528 A | 10/1998 | Goossen |
| 5,838,484 A | 11/1998 | Goossen et al. |
| 5,867,302 A | 2/1999 | Fleming |
| 5,870,221 A | 2/1999 | Goossen |
| 5,883,684 A | 3/1999 | Millikan et al. |
| 5,886,688 A | 3/1999 | Fifield et al. |
| 5,913,594 A | 6/1999 | Iimura |
| 5,914,804 A | 6/1999 | Goossen |
| 5,920,418 A | 7/1999 | Shiono et al. |
| 5,961,198 A | 10/1999 | Hira et al. |
| 5,961,848 A | 10/1999 | Jacquet et al. |
| 6,008,449 A | 12/1999 | Cole |
| 6,028,689 A | 2/2000 | Michalicek et al. |
| 6,031,653 A | 2/2000 | Wang |
| 6,040,937 A | 3/2000 | Miles |
| 6,046,659 A | 4/2000 | Loo et al. |
| 6,055,090 A | 4/2000 | Miles |
| 6,100,861 A | 8/2000 | Cohen et al. |
| 6,123,431 A | 9/2000 | Teragaki et al. |
| 6,124,851 A | 9/2000 | Jacobsen |
| 6,151,089 A | 11/2000 | Yang et al. |
| 6,199,989 B1 | 3/2001 | Maeda et al. |
| 6,242,932 B1 | 6/2001 | Hembree |
| 6,262,697 B1 | 7/2001 | Stephenson |
| 6,273,577 B1 | 8/2001 | Goto et al. |
| 6,301,000 B1 | 10/2001 | Johnson |
| 6,323,415 B1 | 11/2001 | Uematsu et al. |
| 6,323,892 B1 | 11/2001 | Mihara |
| 6,323,923 B1 | 11/2001 | Hoshino et al. |
| 6,323,987 B1 | 11/2001 | Rinaudo et al. |
| 6,327,071 B1 | 12/2001 | Kimura |
| 6,335,235 B1 | 1/2002 | Bhakta et al. |
| 6,351,329 B1 | 2/2002 | Greywall |
| 6,356,378 B1 | 3/2002 | Huibers |
| 6,377,233 B2 | 4/2002 | Colgan et al. |
| 6,381,022 B1 | 4/2002 | Zavracky |
| 6,384,952 B1 | 5/2002 | Clark et al. |
| 6,400,738 B1 | 6/2002 | Tucker et al. |
| 6,407,785 B1 | 6/2002 | Yamazaki |
| 6,433,917 B1 | 8/2002 | Mei et al. |
| 6,437,583 B1 | 8/2002 | Tartagni et al. |
| 6,438,282 B1 | 8/2002 | Takeda et al. |
| 6,452,712 B2 | 9/2002 | Atobe et al. |
| 6,459,668 B1 | 10/2002 | Satou et al. |
| 6,466,354 B1 | 10/2002 | Gudeman |
| 6,518,944 B1 | 2/2003 | Doane et al. |
| 6,519,073 B1 | 2/2003 | Goossen |
| 6,556,338 B2 | 4/2003 | Han et al. |
| 6,574,033 B1 | 6/2003 | Chui et al. |
| 6,580,496 B2 | 6/2003 | Bamji et al. |
| 6,597,490 B2 | 7/2003 | Tayebati |
| 6,603,520 B2 | 8/2003 | Umemoto |
| 6,608,268 B1 | 8/2003 | Goldsmith |
| 6,631,998 B2 | 10/2003 | Egawa et al. |
| 6,632,698 B2 | 10/2003 | Ives |
| 6,643,067 B2 | 11/2003 | Miyamae et al. |
| 6,650,455 B2 | 11/2003 | Miles |
| 6,652,109 B2 | 11/2003 | Nakamura |
| 6,657,832 B2 | 12/2003 | Williams et al. |
| 6,661,561 B2 | 12/2003 | Fitzpatrick et al. |
| 6,674,562 B1 | 1/2004 | Miles et al. |
| 6,680,792 B2 | 1/2004 | Miles |
| 6,698,295 B1 | 3/2004 | Sherrer |
| 6,710,908 B2 | 3/2004 | Miles et al. |
| 6,738,194 B1 | 5/2004 | Ramirez et al. |
| 6,760,146 B2 | 7/2004 | Ikeda et al. |
| 6,768,555 B2 | 7/2004 | Chen et al. |
| 6,792,293 B1 | 9/2004 | Awan et al. |
| 6,794,119 B2 | 9/2004 | Miles |
| 6,813,059 B2 | 11/2004 | Hunter et al. |
| 6,836,366 B1 | 12/2004 | Flanders et al. |
| 6,841,081 B2 | 1/2005 | Chang et al. |
| 6,844,959 B2 | 1/2005 | Huibers et al. |
| 6,849,471 B2 | 2/2005 | Patel et al. |
| 6,853,418 B2 | 2/2005 | Suzuki et al. |
| 6,862,127 B1 | 3/2005 | Ishii |
| 6,864,882 B2 | 3/2005 | Newton |
| 6,867,896 B2 | 3/2005 | Miles |
| 6,870,654 B2 | 3/2005 | Lin et al. |
| 6,882,458 B2 | 4/2005 | Lin et al. |
| 6,882,461 B1 | 4/2005 | Tsai et al. |
| 6,912,022 B2 | 6/2005 | Lin et al. |
| 6,913,942 B2 | 7/2005 | Patel et al. |
| 6,940,630 B2 | 9/2005 | Xie |
| 6,947,200 B2 | 9/2005 | Huibers |
| 6,951,401 B2 | 10/2005 | Van Hees et al. |
| 6,952,303 B2 | 10/2005 | Lin et al. |
| 6,958,847 B2 | 10/2005 | Lin |
| 6,960,305 B2 | 11/2005 | Doan et al. |
| 6,980,350 B2 | 12/2005 | Hung et al. |
| 6,982,820 B2 | 1/2006 | Tsai |
| 7,002,726 B2 | 2/2006 | Patel et al. |
| 7,006,272 B2 | 2/2006 | Tsai |
| 7,009,754 B2 | 3/2006 | Huibers |
| 7,027,204 B2 | 4/2006 | Trisnadi et al. |
| 7,034,981 B2 | 4/2006 | Makigaki |
| 7,042,444 B2 | 5/2006 | Cok |
| 7,046,422 B2 | 5/2006 | Kimura et al. |
| 7,072,093 B2 | 7/2006 | Piehl et al. |
| 7,113,339 B2 | 9/2006 | Taguchi et al. |

(56) References Cited

U.S. PATENT DOCUMENTS

| | | |
|---|---|---|
| 7,119,945 B2 | 10/2006 | Kothari et al. |
| 7,123,216 B1 | 10/2006 | Miles |
| 7,126,738 B2 | 10/2006 | Miles |
| 7,130,104 B2 | 10/2006 | Cummings |
| 7,136,213 B2 | 11/2006 | Chui |
| 7,184,195 B2 | 2/2007 | Yang |
| 7,184,202 B2 | 2/2007 | Miles et al. |
| 7,198,973 B2 | 4/2007 | Lin et al. |
| 7,221,495 B2 | 5/2007 | Miles et al. |
| 7,224,512 B2 | 5/2007 | Liu et al. |
| 7,236,284 B2 | 6/2007 | Miles |
| 7,245,285 B2 | 7/2007 | Yeh et al. |
| 7,289,259 B2 | 10/2007 | Chui et al. |
| 7,302,157 B2 | 11/2007 | Chui |
| 7,304,784 B2 | 12/2007 | Chui et al. |
| 7,321,456 B2 | 1/2008 | Cummings |
| 7,321,457 B2 | 1/2008 | Heald |
| 7,327,510 B2 | 2/2008 | Cummings et al. |
| 7,372,613 B2 | 5/2008 | Chui et al. |
| 7,372,619 B2 | 5/2008 | Miles |
| 7,385,744 B2 | 6/2008 | Kogut et al. |
| 7,385,762 B2 | 6/2008 | Cummings |
| 7,389,476 B2 | 6/2008 | Senda et al. |
| 7,400,488 B2 | 7/2008 | Lynch et al. |
| 7,405,852 B2 | 7/2008 | Brosnihan et al. |
| 7,417,746 B2 | 8/2008 | Lin et al. |
| 7,420,725 B2 | 9/2008 | Kothari |
| 7,436,573 B2 | 10/2008 | Doan et al. |
| 7,446,926 B2 | 11/2008 | Sampsell |
| 7,459,402 B2 | 12/2008 | Doan et al. |
| 7,460,291 B2 | 12/2008 | Sampsell et al. |
| 7,460,292 B2 | 12/2008 | Chou |
| 7,476,327 B2 | 1/2009 | Tung et al. |
| 7,477,440 B1 | 1/2009 | Huang |
| 7,477,809 B1 | 1/2009 | Tan et al. |
| 7,492,503 B2 | 2/2009 | Chui |
| 7,508,566 B2 | 3/2009 | Feenstra et al. |
| 7,508,571 B2 | 3/2009 | Gally et al. |
| 7,515,327 B2 | 4/2009 | Cummings |
| 7,527,995 B2 | 5/2009 | Sampsell |
| 7,532,377 B2 | 5/2009 | Miles |
| 7,535,621 B2 | 5/2009 | Chiang |
| 7,542,198 B2 | 6/2009 | Kothari |
| 7,550,794 B2 | 6/2009 | Miles et al. |
| 7,550,810 B2 | 6/2009 | Mignard et al. |
| 7,554,711 B2 | 6/2009 | Miles |
| 7,554,714 B2 | 6/2009 | Chui et al. |
| 7,557,935 B2 | 7/2009 | Baruch |
| 7,561,321 B2 | 7/2009 | Heald |
| 7,561,323 B2 | 7/2009 | Gally et al. |
| 7,564,612 B2 | 7/2009 | Chui |
| 7,566,664 B2 | 7/2009 | Yan et al. |
| 7,567,373 B2 | 7/2009 | Chui et al. |
| 7,569,488 B2 | 8/2009 | Rafanan |
| 7,612,932 B2 | 11/2009 | Chui et al. |
| 7,612,933 B2 | 11/2009 | Djordjev |
| 7,629,197 B2 | 12/2009 | Luo et al. |
| 7,630,119 B2 | 12/2009 | Tung et al. |
| 7,630,121 B2 | 12/2009 | Endisch et al. |
| 7,643,199 B2 | 1/2010 | Lan |
| 7,643,202 B2 | 1/2010 | Sasagawa |
| 7,649,671 B2 | 1/2010 | Kothari et al. |
| 7,663,714 B2 | 2/2010 | Haga et al. |
| 7,663,794 B2 | 2/2010 | Cummings |
| 7,672,035 B2 | 3/2010 | Sampsell et al. |
| 7,692,844 B2 | 4/2010 | Miles |
| 7,704,772 B2 | 4/2010 | Tung et al. |
| 7,715,085 B2 | 5/2010 | Sasagawa |
| 7,719,500 B2 | 5/2010 | Chui |
| 7,738,157 B2 | 6/2010 | Miles |
| 7,742,220 B2 | 6/2010 | Kogut et al. |
| 7,746,539 B2 | 6/2010 | Sampsell |
| 7,768,690 B2 | 8/2010 | Sampsell |
| 7,773,286 B2 | 8/2010 | Mignard |
| 7,782,517 B2 | 8/2010 | Griffiths et al. |
| 7,782,523 B2 | 8/2010 | Ishii |
| 7,787,173 B2 | 8/2010 | Chui |
| 7,808,694 B2 | 10/2010 | Miles |
| 7,813,029 B2 | 10/2010 | Kothari et al. |
| 7,826,120 B2 | 11/2010 | Miles |
| 7,830,586 B2 | 11/2010 | Miles |
| 7,830,587 B2 | 11/2010 | Miles |
| 7,830,588 B2 | 11/2010 | Miles |
| 7,835,061 B2 | 11/2010 | Kogut et al. |
| 7,839,557 B2 | 11/2010 | Chui et al. |
| 7,847,999 B2 | 12/2010 | Lee et al. |
| 7,848,003 B2 | 12/2010 | Kothari et al. |
| 7,852,544 B2 | 12/2010 | Sampsell |
| 7,852,545 B2 | 12/2010 | Miles |
| 7,872,792 B2 | 1/2011 | Miles |
| 7,884,989 B2 | 2/2011 | Gally et al. |
| 7,889,415 B2 | 2/2011 | Kothari |
| 7,889,417 B2 | 2/2011 | Sasagawa |
| 7,893,919 B2 | 2/2011 | Kothari et al. |
| 7,898,722 B2 | 3/2011 | Miles |
| 2001/0003487 A1 | 6/2001 | Miles |
| 2001/0022636 A1 | 9/2001 | Yang et al. |
| 2001/0028503 A1 | 10/2001 | Flanders et al. |
| 2001/0043171 A1 | 11/2001 | Van Gorkom et al. |
| 2001/0055076 A1 | 12/2001 | Ochi et al. |
| 2002/0024711 A1 | 2/2002 | Miles |
| 2002/0044445 A1 | 4/2002 | Bohler et al. |
| 2002/0054424 A1 | 5/2002 | Miles |
| 2002/0070931 A1 | 6/2002 | Ishikawa |
| 2002/0075555 A1 | 6/2002 | Miles |
| 2002/0080465 A1 | 6/2002 | Han et al. |
| 2002/0126364 A1 | 9/2002 | Miles |
| 2002/0146200 A1 | 10/2002 | Kudrle et al. |
| 2002/0149828 A1 | 10/2002 | Miles |
| 2002/0149834 A1 | 10/2002 | Mei et al. |
| 2002/0154422 A1 | 10/2002 | Sniegowski et al. |
| 2002/0197761 A1 | 12/2002 | Patel et al. |
| 2003/0011864 A1 | 1/2003 | Flanders |
| 2003/0016428 A1 | 1/2003 | Kato et al. |
| 2003/0016930 A1 | 1/2003 | Inditsky |
| 2003/0026536 A1 | 2/2003 | Ho |
| 2003/0035196 A1 | 2/2003 | Walker |
| 2003/0043157 A1 | 3/2003 | Miles |
| 2003/0053078 A1 | 3/2003 | Missey et al. |
| 2003/0098957 A1 | 5/2003 | Haldiman |
| 2003/0119221 A1 | 6/2003 | Cunningham et al. |
| 2003/0123125 A1 | 7/2003 | Little |
| 2003/0128538 A1* | 7/2003 | Shinohara et al. ............... 362/31 |
| 2003/0138669 A1 | 7/2003 | Kojima et al. |
| 2003/0160919 A1 | 8/2003 | Suzuki et al. |
| 2003/0173504 A1 | 9/2003 | Cole et al. |
| 2003/0202265 A1 | 10/2003 | Reboa et al. |
| 2003/0202266 A1 | 10/2003 | Ring et al. |
| 2004/0008396 A1 | 1/2004 | Stappaerts |
| 2004/0008438 A1 | 1/2004 | Sato |
| 2004/0027671 A1 | 2/2004 | Wu et al. |
| 2004/0027701 A1 | 2/2004 | Ishikawa |
| 2004/0043552 A1 | 3/2004 | Strumpell et al. |
| 2004/0066477 A1 | 4/2004 | Morimoto et al. |
| 2004/0070711 A1 | 4/2004 | Wen et al. |
| 2004/0075967 A1 | 4/2004 | Lynch et al. |
| 2004/0076802 A1 | 4/2004 | Tompkin et al. |
| 2004/0080035 A1 | 4/2004 | Delapierre |
| 2004/0100594 A1 | 5/2004 | Huibers et al. |
| 2004/0100677 A1 | 5/2004 | Huibers et al. |
| 2004/0125281 A1 | 7/2004 | Lin et al. |
| 2004/0125282 A1 | 7/2004 | Lin et al. |
| 2004/0145811 A1 | 7/2004 | Lin et al. |
| 2004/0147198 A1 | 7/2004 | Lin et al. |
| 2004/0170373 A1 | 9/2004 | Kim |
| 2004/0175577 A1 | 9/2004 | Lin et al. |
| 2004/0184134 A1 | 9/2004 | Makigaki |
| 2004/0188599 A1 | 9/2004 | Viktorovitch et al. |
| 2004/0207897 A1 | 10/2004 | Lin |
| 2004/0209195 A1 | 10/2004 | Lin |
| 2004/0217264 A1 | 11/2004 | Wood et al. |
| 2004/0217919 A1 | 11/2004 | Piehl et al. |
| 2004/0218251 A1 | 11/2004 | Piehl et al. |
| 2004/0259010 A1 | 12/2004 | Kanbe |

(56) References Cited

U.S. PATENT DOCUMENTS

| | | |
|---|---|---|
| 2005/0002082 A1 | 1/2005 | Miles |
| 2005/0003667 A1 | 1/2005 | Lin et al. |
| 2005/0024557 A1 | 2/2005 | Lin |
| 2005/0030732 A1 | 2/2005 | Kimura et al. |
| 2005/0035699 A1 | 2/2005 | Tsai |
| 2005/0036095 A1 | 2/2005 | Yeh et al. |
| 2005/0046919 A1 | 3/2005 | Taguchi et al. |
| 2005/0046922 A1 | 3/2005 | Lin et al. |
| 2005/0046948 A1 | 3/2005 | Lin |
| 2005/0068627 A1 | 3/2005 | Nakamura et al. |
| 2005/0078348 A1 | 4/2005 | Lin |
| 2005/0088719 A1 | 4/2005 | Patel et al. |
| 2005/0117190 A1* | 6/2005 | Iwauchi et al. ............... 359/237 |
| 2005/0117623 A1 | 6/2005 | Shchukin et al. |
| 2005/0128543 A1 | 6/2005 | Phillips et al. |
| 2005/0133761 A1* | 6/2005 | Thielemans ............. 252/299.61 |
| 2005/0168849 A1 | 8/2005 | Lin |
| 2005/0179378 A1 | 8/2005 | Oooka et al. |
| 2005/0195175 A1 | 9/2005 | Anderson |
| 2005/0195462 A1 | 9/2005 | Lin |
| 2005/0225686 A1 | 10/2005 | Brummack et al. |
| 2005/0231977 A1 | 10/2005 | Hayakawa |
| 2005/0259939 A1 | 11/2005 | Rinko |
| 2005/0275930 A1 | 12/2005 | Patel et al. |
| 2006/0002655 A1 | 1/2006 | Smits |
| 2006/0007517 A1 | 1/2006 | Tsai |
| 2006/0017379 A1 | 1/2006 | Su et al. |
| 2006/0017689 A1 | 1/2006 | Faase et al. |
| 2006/0024880 A1 | 2/2006 | Chui et al. |
| 2006/0038643 A1 | 2/2006 | Xu et al. |
| 2006/0044523 A1 | 3/2006 | Teijido et al. |
| 2006/0065940 A1 | 3/2006 | Kothari |
| 2006/0066541 A1 | 3/2006 | Gally et al. |
| 2006/0066641 A1 | 3/2006 | Gally et al. |
| 2006/0066783 A1 | 3/2006 | Sampsell |
| 2006/0077155 A1 | 4/2006 | Chui et al. |
| 2006/0077156 A1 | 4/2006 | Chui et al. |
| 2006/0077617 A1 | 4/2006 | Floyd |
| 2006/0082588 A1 | 4/2006 | Mizuno et al. |
| 2006/0082863 A1 | 4/2006 | Piehl et al. |
| 2006/0114244 A1 | 6/2006 | Saxena et al. |
| 2006/0132927 A1 | 6/2006 | Yoon |
| 2006/0180886 A1 | 8/2006 | Tsang |
| 2006/0209012 A1 | 9/2006 | Hagood |
| 2006/0220160 A1 | 10/2006 | Miles |
| 2006/0262562 A1* | 11/2006 | Fukasawa et al. ............ 362/615 |
| 2006/0290683 A1 | 12/2006 | Pasquariello et al. |
| 2006/0291769 A1 | 12/2006 | Spoonhower et al. |
| 2007/0020948 A1 | 1/2007 | Piehl et al. |
| 2007/0077525 A1 | 4/2007 | Davis et al. |
| 2007/0086078 A1 | 4/2007 | Hagood et al. |
| 2007/0097694 A1 | 5/2007 | Faase et al. |
| 2007/0115415 A1 | 5/2007 | Piehl et al. |
| 2007/0116424 A1 | 5/2007 | Ting et al. |
| 2007/0125415 A1 | 6/2007 | Sachs |
| 2007/0125937 A1 | 6/2007 | Eliasson et al. |
| 2007/0133935 A1 | 6/2007 | Fine |
| 2007/0138608 A1 | 6/2007 | Ikehashi |
| 2007/0153860 A1 | 7/2007 | Chang-Hasnain et al. |
| 2007/0171330 A1 | 7/2007 | Hung et al. |
| 2007/0171418 A1 | 7/2007 | Nyhart |
| 2007/0196040 A1* | 8/2007 | Wang et al. ....................... 385/1 |
| 2007/0216987 A1 | 9/2007 | Hagood et al. |
| 2007/0229737 A1 | 10/2007 | Takeda |
| 2007/0236957 A1 | 10/2007 | Koganezawa et al. |
| 2007/0241340 A1 | 10/2007 | Pan |
| 2007/0253054 A1 | 11/2007 | Miles |
| 2007/0258123 A1 | 11/2007 | Xu et al. |
| 2007/0279727 A1 | 12/2007 | Gandhi et al. |
| 2007/0279730 A1 | 12/2007 | Heald |
| 2007/0279935 A1 | 12/2007 | Gardiner et al. |
| 2007/0285761 A1 | 12/2007 | Zhong et al. |
| 2008/0002299 A1 | 1/2008 | Thurn |
| 2008/0007541 A1 | 1/2008 | Eliasson et al. |
| 2008/0013145 A1 | 1/2008 | Chui et al. |
| 2008/0030650 A1 | 2/2008 | Kitagawa et al. |
| 2008/0030657 A1 | 2/2008 | Wu et al. |
| 2008/0055706 A1 | 3/2008 | Chui et al. |
| 2008/0061703 A1 | 3/2008 | Le Roy et al. |
| 2008/0068697 A1 | 3/2008 | Haluzak et al. |
| 2008/0079687 A1 | 4/2008 | Cernasov |
| 2008/0080043 A1 | 4/2008 | Chui et al. |
| 2008/0088910 A1 | 4/2008 | Miles |
| 2008/0094690 A1 | 4/2008 | Luo et al. |
| 2008/0110855 A1 | 5/2008 | Cummings |
| 2008/0158645 A1 | 7/2008 | Chiang |
| 2008/0186581 A1 | 8/2008 | Bita et al. |
| 2008/0192484 A1 | 8/2008 | Lee |
| 2008/0208517 A1 | 8/2008 | Shamaie |
| 2008/0278460 A1 | 11/2008 | Arnett et al. |
| 2008/0278663 A1 | 11/2008 | Krishnan et al. |
| 2008/0297880 A1 | 12/2008 | Steckl et al. |
| 2009/0021884 A1 | 1/2009 | Nakamura |
| 2009/0078316 A1 | 3/2009 | Khazeni |
| 2009/0086466 A1 | 4/2009 | Sugita et al. |
| 2009/0101192 A1 | 4/2009 | Kothari et al. |
| 2009/0103161 A1 | 4/2009 | Kothari et al. |
| 2009/0103165 A1 | 4/2009 | Kothari et al. |
| 2009/0103166 A1 | 4/2009 | Khazeni et al. |
| 2009/0122384 A1 | 5/2009 | Felnhofer et al. |
| 2009/0126792 A1 | 5/2009 | Gruhlke et al. |
| 2009/0211885 A1 | 8/2009 | Steeneken et al. |
| 2009/0213450 A1 | 8/2009 | Sampsell |
| 2009/0213451 A1 | 8/2009 | Tung et al. |
| 2009/0231275 A1 | 9/2009 | Odgers |
| 2009/0256218 A1 | 10/2009 | Mignard et al. |
| 2009/0273823 A1 | 11/2009 | Tung et al. |
| 2009/0279162 A1 | 11/2009 | Chui |
| 2009/0293955 A1 | 12/2009 | Kothari et al. |
| 2009/0303417 A1 | 12/2009 | Mizushima et al. |
| 2009/0320899 A1 | 12/2009 | Schiavoni et al. |
| 2010/0051089 A1 | 3/2010 | Khazeni et al. |
| 2010/0053148 A1 | 3/2010 | Khazeni et al. |
| 2010/0080890 A1 | 4/2010 | Tung et al. |
| 2010/0085626 A1 | 4/2010 | Tung et al. |
| 2010/0118382 A1 | 5/2010 | Kothari et al. |
| 2010/0142226 A1 | 6/2010 | Vogt et al. |
| 2010/0180946 A1 | 7/2010 | Gruhlke et al. |
| 2010/0187422 A1 | 7/2010 | Kothari et al. |
| 2010/0236624 A1 | 9/2010 | Khazeni et al. |
| 2010/0284055 A1 | 11/2010 | Kothari et al. |
| 2010/0309572 A1 | 12/2010 | Mignard |
| 2011/0019380 A1 | 1/2011 | Miles |
| 2011/0026095 A1 | 2/2011 | Kothari et al. |
| 2011/0026096 A1 | 2/2011 | Miles |
| 2011/0038027 A1 | 2/2011 | Miles |
| 2011/0044496 A1 | 2/2011 | Chui et al. |
| 2011/0069371 A1 | 3/2011 | Kothari et al. |
| 2011/0080632 A1 | 4/2011 | Miles |
| 2011/0116156 A1 | 5/2011 | Kothari |
| 2011/0134505 A1 | 6/2011 | Sasagawa |
| 2011/0170166 A1 | 7/2011 | Miles |
| 2011/0170167 A1 | 7/2011 | Miles |
| 2011/0170168 A1 | 7/2011 | Endisch et al. |
| 2011/0188109 A1 | 8/2011 | Chui et al. |
| 2011/0188110 A1 | 8/2011 | Miles |
| 2012/0194896 A1 | 8/2012 | Kothari et al. |

FOREIGN PATENT DOCUMENTS

| | | |
|---|---|---|
| DE | 199 42 513 | 3/2001 |
| DE | 10 2006 039 0 | 2/2008 |
| DE | 10 2007 02509 | 12/2008 |
| EP | 0 035 299 | 9/1983 |
| EP | 0 668 490 | 8/1995 |
| EP | 0 695 959 | 2/1996 |
| EP | 0 879 991 | 11/1998 |
| EP | 0 907 050 | 4/1999 |
| EP | 0 969 306 | 1/2000 |
| EP | 0 986 077 | 3/2000 |
| EP | 1 122 577 | 8/2001 |
| EP | 1 205 782 | 5/2002 |
| EP | 1 227 346 | 7/2002 |
| EP | 1 231 757 | 8/2002 |

(56) References Cited

FOREIGN PATENT DOCUMENTS

| | | |
|---|---|---|
| EP | 1 275 997 | 1/2003 |
| EP | 1 389 775 | 2/2004 |
| EP | 1 403 212 | 3/2004 |
| EP | 1 473 581 | 11/2004 |
| EP | 1 698 918 | 9/2006 |
| EP | 1 732 141 | 12/2006 |
| EP | 1 762 778 | 3/2007 |
| EP | 1 928 028 | 6/2008 |
| FR | 2 889 597 | 2/2007 |
| GB | 2 336 933 | 11/1999 |
| JP | 56-088111 | 7/1981 |
| JP | 57-3266 | 1/1982 |
| JP | 58-115781 | 8/1983 |
| JP | 60-147718 | 8/1985 |
| JP | 60-242408 | 12/1985 |
| JP | 02 053040 | 2/1990 |
| JP | 04-190323 | 7/1992 |
| JP | 04-238321 | 8/1992 |
| JP | 5-49238 | 2/1993 |
| JP | 5-281479 | 10/1993 |
| JP | 06 047928 | 6/1994 |
| JP | 08-051230 | 2/1996 |
| JP | 08-094992 | 4/1996 |
| JP | 09-068722 | 3/1997 |
| JP | 09-160032 | 6/1997 |
| JP | 09-189910 | 7/1997 |
| JP | 09-311333 | 12/1997 |
| JP | 11-52887 | 2/1999 |
| JP | 11211999 | 8/1999 |
| JP | 11-260572 | 9/1999 |
| JP | 11-295725 | 10/1999 |
| JP | 2000 147262 | 5/2000 |
| JP | 2001-221913 | 8/2001 |
| JP | 2001 249283 | 9/2001 |
| JP | 2002-062490 | 2/2002 |
| JP | 2002-072284 | 3/2002 |
| JP | 2002-221678 | 8/2002 |
| JP | 2002-229023 | 8/2002 |
| JP | 2003-340795 | 2/2003 |
| JP | 2003-140118 | 5/2003 |
| JP | 2003-173713 | 6/2003 |
| JP | 2003 177336 | 6/2003 |
| JP | 2003-188959 | 7/2003 |
| JP | 2004-012642 | 1/2004 |
| JP | 2004-070189 | 3/2004 |
| JP | 2004-087409 | 3/2004 |
| JP | 2004 103411 | 4/2004 |
| JP | 2004-126196 | 4/2004 |
| JP | 2004-145109 | 5/2004 |
| JP | 2004-212638 | 7/2004 |
| JP | 2004-212680 | 7/2004 |
| JP | 2005 044732 | 2/2005 |
| JP | 2005 279831 | 10/2005 |
| JP | 2005 292546 | 10/2005 |
| JP | 2005-308871 | 11/2005 |
| JP | 2006065360 | 3/2006 |
| JP | 2006 215509 | 8/2006 |
| JP | 2006 319408 | 11/2006 |
| JP | 2006309408 A | 11/2006 |
| JP | 2007 027150 | 2/2007 |
| JP | 2007 218540 | 8/2007 |
| JP | 2007 279474 | 10/2007 |
| TW | 200510868 | 3/2005 |
| WO | WO 95/15582 | 6/1995 |
| WO | WO 97/44707 | 11/1997 |
| WO | WO 98/14804 | 4/1998 |
| WO | WO 98/43129 | 10/1998 |
| WO | WO 99/04296 | 1/1999 |
| WO | WO 99/64785 | 12/1999 |
| WO | WO 00/50807 | 8/2000 |
| WO | WO 01/06816 | 1/2001 |
| WO | WO 01/29148 | 4/2001 |
| WO | WO 01/53113 | 7/2001 |
| WO | WO 02/24570 | 3/2002 |
| WO | WO 02/086582 | 10/2002 |
| WO | WO 02/097324 | 12/2002 |
| WO | WO 03/105198 | 12/2003 |
| WO | WO 2004/012004 | 2/2004 |
| WO | WO 2004/036270 | 4/2004 |
| WO | WO 2004/114418 | 12/2004 |
| WO | WO 2005/114311 | 12/2005 |
| WO | WO 2006/035698 | 4/2006 |
| WO | WO-2006036506 | 4/2006 |
| WO | WO 2006/091860 | 8/2006 |
| WO | WO 2006/091904 | 8/2006 |
| WO | WO 2006/137337 | 12/2006 |
| WO | WO 2007/036422 | 4/2007 |
| WO | WO 2007/045875 | 4/2007 |
| WO | WO 2007/053438 | 5/2007 |
| WO | WO 2007/072998 | 6/2007 |
| WO | WO 2007/073203 | 6/2007 |
| WO | WO 2007/142978 | 12/2007 |
| WO | WO 2008/045224 | 4/2008 |
| WO | WO 2008/062363 | 5/2008 |
| WO | WO 2008/068607 | 6/2008 |

OTHER PUBLICATIONS

Atkins et al., May 3, 2007, Digital Waveguide Touch™—A New Touch Screen Platform, RPO Inc, White Paper, 6 pp.

Brosnihan et al., Jun. 2003, Optical IMEMS—a fabrication process for MEMS optical switches with integrated on-chip electronic, Transducers, Solid-State Sensors, Actuators and Microsystems, 12$^{th}$ International Conference 2003, 2(8-12):1638-1642.

Cacharelis et al., 1997, A Reflective-mode PDLC Light Valve Display Technology, Proceedings of European Solid State Device Research Conference (ESSDERC), pp. 596-599.

Dokmeci et al., Dec. 2004, Two-axis single-crystal silicon micromirror arrays, Journal of Microelectromechanical Systems, 13(6):1006-1017.

Gokturk et al., 2004, A Time-Of-Flight Depth Sensor—System Description, Issues and Solutions, 2004 Conference on Computer Vision and Pattern Recognition Workshop (CVPRW'04), 3:35-42.

Imenes et al., 2004, Spectral beam splitting technology for increased conversion efficiency in solar concentrating systems: a review, Solar Energy Materials & Solar Cells 84:19-69.

Maier et al., 1996, 1.3' active matrix liquid crystal spatial light modulator with 508 dpi resolution, SPIE vol. 2754, pp. 171-179.

Neal et al., Surface plasmon enhanced emission from dye doped polymer layers, Optics Express, 13(14):5522-5527, Jul. 1, 2005.

Petschick et al., Fabry-Perot-Interferometer, Nov. 15, 2002, retrieved from the internet: URL:http://pl.physik.tu-berlin.de/groups/pg279/protokollesse02/04_fpi.pdf> retrieved on Apr. 14, 2009.

Billard, Tunable Capacitor, 5th Annual Review of LETI, Jun. 24, 2003, p. 7.

Conner, Hybrid Color Display Using Optical Interference Filter Array, SID Digest, pp. 577-580 (1993).

Feenstra et al., Electrowetting displays, Liquavista BV, 16 pp., Jan. 2006.

Hohlfeld et al., Jun. 2003, Micro-machined tunable optical filters with optimized band-pass spectrum, 12th International Conference on Transducers, Solid-State Sensors, Actuators and Microsystems, 2:1494-1497.

Jerman et al., A Miniature Fabry-Perot Interferometer with a Corrugated Silicon Diaphragm Support, (1988).

Jerman et al., Miniature Fabry-Perot Interferometers Micromachined in Silicon for Use in Optical Fiber WDM Systems, Transducers, San Francisco, Jun. 24-27, 1991, Proceedings on the Int'l. Conf. on Solid State Sensors and Actuators, Jun. 24, 1991, pp. 372-375.

Kowarz et al., Conformal grating electromechanical system (GEMS) for high-speed digital light modulation, Proceedings of the IEEEE 15th. Annual International Conference on Micro Electro Mechanical Systems, MEMS 2002, pp. 568-573.

Lezec, Submicrometer dimple array based interference color field displays and sensors, Nano Lett. 7(2):329-333, Dec. 23, 2006.

Londergan et al., Advanced processes for MEMS-based displays, Proceedings of the Asia Display 2007, SID, 1:107-112.

Longhurst, 1963, Chapter IX: Multiple Beam Interferometry, in Geometrical and Physical Optics, pp. 153-157.

Mehregany et al., 1996, MEMS applications in optical systems,

(56) References Cited

OTHER PUBLICATIONS

IEEE/LEOS 1996 Summer Topical Meetings, pp. 75-76.
Miles et al, Oct. 21, 1997, A MEMS based interferometric modulator (IMOD) for display applications, Proceedings of Sensors Expo, pp. 281-284.
Miles, A New Reflective FPD Technology Using Interferometric Modulation, Journal of the SID, 5/4, 1997.
Miles, Interferometric modulation: MOEMS as an enabling technology for high performance reflective displays, Proceedings of SPIE, 4985:131-139, 2003.
Nakagawa et al., Feb. 1, 2002, Wide-field-of-view narrow-band spectral filters based on photonic crystal nanocavities, Optics Letters, 27(3):191-193.
Nieminen et al., 2004, Design of a temperature-stable RF MEM capacitor, IEEE Journal of Microelectromechanical Systems, 13(5):705-714.
Pape et al., Characteristics of the deformable mirror device for optical information processing, Optical Engineering, 22(6):676-681, Nov.-Dec. 1983.
Taii et al., A transparent sheet display by plastic MEMS, Journal of the SID 14(8):735-741, 2006.
Tolansky, 1948, Chapter II: Multiple-Beam Interference, in Multiple-bean Interferometry of Surfaces and Films, Oxford at the Clarendon Press, pp. 8-11.
Wang, Jun. 29-Jul. 1, 2002, Design and fabrication of a novel two-dimension MEMS-based tunable capacitor, IEEE 2002 International Conference on Communications, Circuits and Systems and West Sino Expositions, 2:1766-1769.
IPRP dated Feb. 24, 2010 in PCT/US08/083678.
Office Action in Chinese Application No. 200880116109.4 dated Aug. 10, 2011.
Office Action in Chinese Application No. 200880116109.4 dated Jan. 11, 2012.
Office Action in Chinese Application No. 200880116109.4 dated May 23, 2012.
Office Action in Japanese Application No. 2010-534246 dated May 29, 2012.
Official Communication Including Taiwan Search Report—TW097144259—TIPO—Jan. 24, 2014.
Taiwan Search Report—TW097144259—TIPO—Jan. 5, 2014.

\* cited by examiner

SIMULTANEOUS LIGHT COLLECTION AND ILLUMINATION ON AN ACTIVE DISPLAY

CROSS-REFERENCE TO RELATED APPLICATIONS

This application claims the benefit of U.S. Provisional Application No. 61/093,686, filed Sep. 2, 2008 and U.S. patent application Ser. No. 11/941,851, filed Nov. 16, 2007. This application is related to U.S. patent application Ser. No. 12/207,270, filed Sep. 9, 2008.

BACKGROUND

1. Field of the Invention

The present invention related to microelectromechanical systems (MEMS).

2. Description of the Related Art

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator ("IMOD"). As used herein, the term interferometric modulator, interferometric light modulator, or IMOD refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator.

IMODs can be arranged in addressable arrays to create active displays. Similarly, other MEMS and non-MEMS technologies, such as liquid crystal displays (LCDs), light-emitting diodes (LEDs), including organic LEDS (OLEDs), electrophoretic, and field emission displays (FEDs) are all employed as active displays for television, computer monitor, cell phone, or personal digital assistant (PDA) screens, etc. Such devices have a wide range of applications, and it would be beneficial in the art to utilize and/or modify the characteristics of these types of devices so that their features can be exploited in improving existing products and creating new products that have not yet been developed.

SUMMARY

In one embodiment, a display device includes an active array of display pixels having a front display surface for facing a viewer and a back display surface, at least one collection film adjacent to one of the front or back display surfaces, the collection film having a front collection film surface, a back collection film surface, at least one edge, and a plurality of light-turning features, wherein the light-turning features are configured to redirect light between the front or back collection film surface and an edge of the collection film, and a photovoltaic device disposed on the edge of the collection film and oriented to receive light laterally transmitted from the light-turning features through the collection film.

In another embodiment, a display device includes an array of display pixels. At least one collection film is disposed next to the array of display pixels. The collection film has a plurality of light-turning features, where the light-turning features are configured to redirect light between a front or back collection film surface and edges of the collection film. At least one photovoltaic device is disposed on an edge of the collection film, where the photovoltaic device is oriented to receive light laterally transmitted from the light-turning features through the collection film. At least one light source is disposed on an edge, where the light source emits light laterally through the collection film to be turned by the light-turning features toward the array of display pixels.

In another embodiment, a display device includes a means for displaying images on an array of display pixels, a means for converting light energy into an alternate form of energy, and a means for turning light from a direction incident on the display surface to a lateral direction along the display surface toward the means for converting light energy into an alternate form of energy.

In another embodiment, a method of light collection and image display includes actively displaying images in an image area, collecting light from the image area, turning the light from the image area to at least one edge of the image area, and converting the light to an electrical current.

In another embodiment, a method of manufacturing a display device includes operatively coupling a collection film to a front or back display surface of an active array of display pixels. The collection film has a front collection film surface, a back collection film surface, at least one edge, and a plurality of light-turning features. The method also includes aligning a photovoltaic device with the edge of the collection film, such that ambient light is re-directed by the light-turning features from the front collection film surface to the photovoltaic device at the edge of the collection film to be converted into electrical energy.

DETAILED DESCRIPTION OF PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to programmably display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry).

Certain embodiments of the present invention are directed to a collection film coupled with a photovoltaic device for gathering light through the active display region and converting the light into electric energy. The collection film, placed above or below an array of display pixels, has light-turning features which redirects some of the light received on the active display region and shunts the light to the edges of the collection film where at least one photovoltaic device is located. In some embodiments, a light source, such as a LED, is also placed at an edge of the same film and emits light which is redirected by the light-turning features to illuminate the display.

While embodiments of FIGS. 8-20 can employ collection films with photovoltaic devices in conjunction with a variety of display technologies, FIGS. 1-7E illustrate an interferometric modulator (IMOD) display technology useful for the embodiments of FIGS. 8-20.

Figure 1:
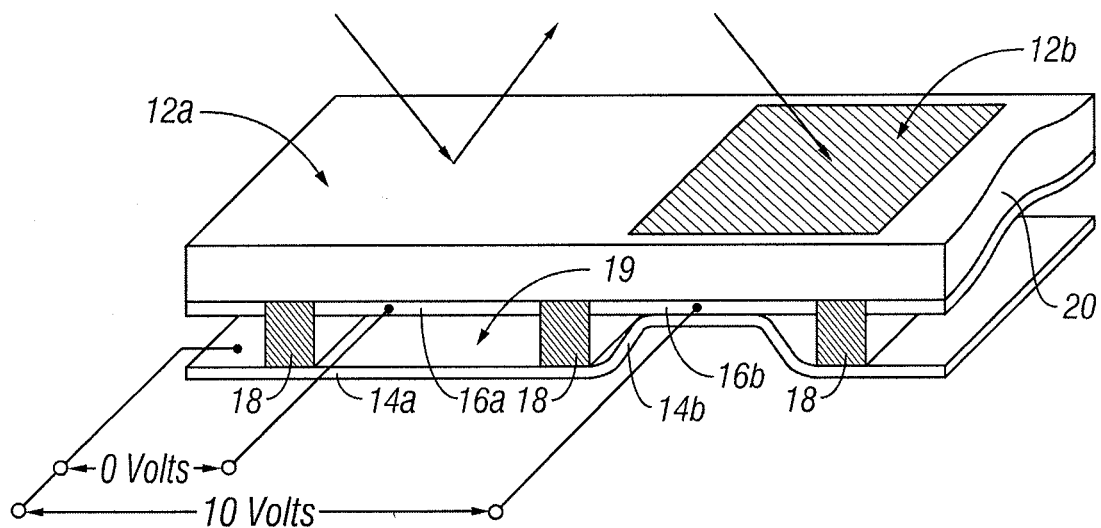
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
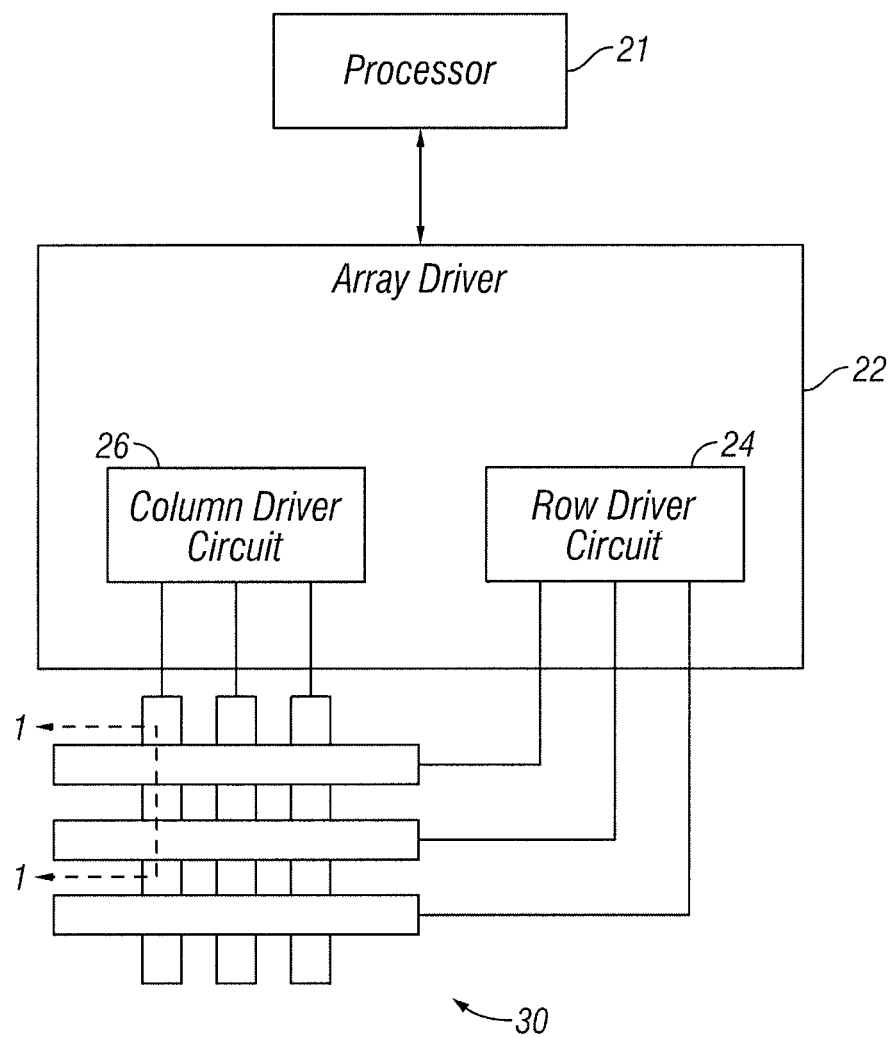
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse.

This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
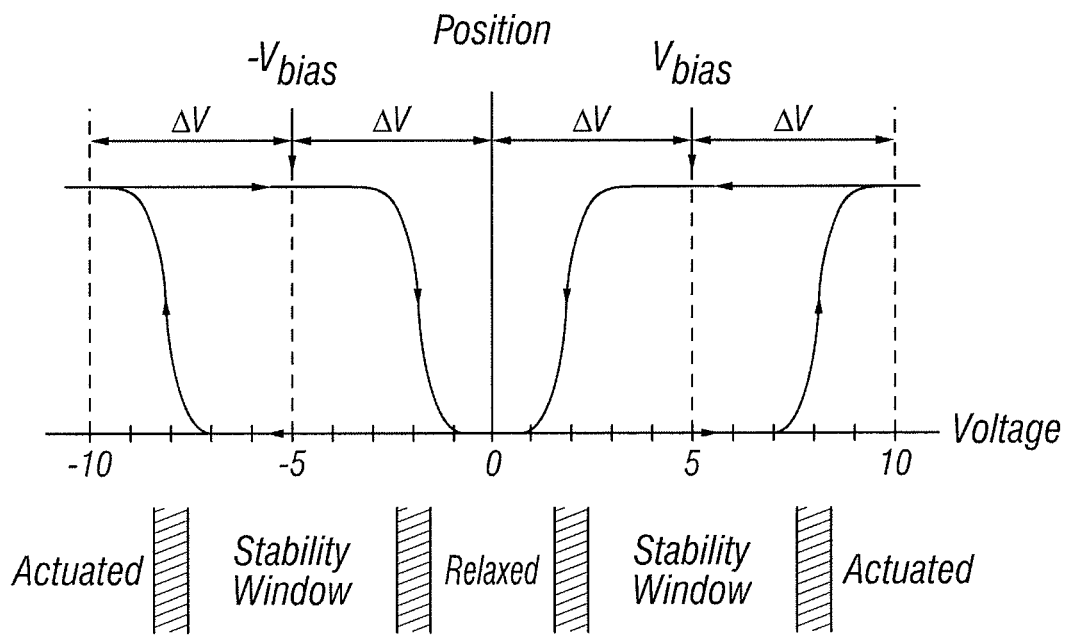
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
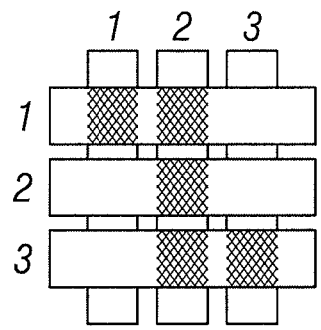
FIG. 5A illustrates one exemplary frame of display data in the 3×3 interferometric modulator display of FIG. 2.
Figure 5B:
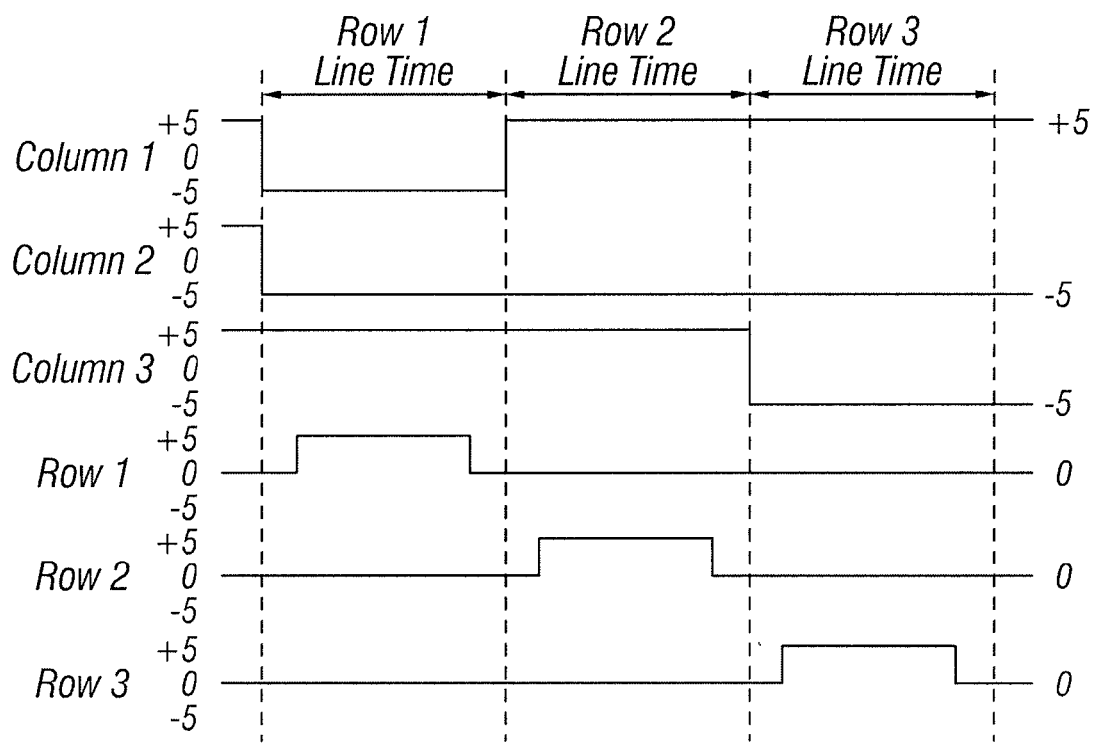
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
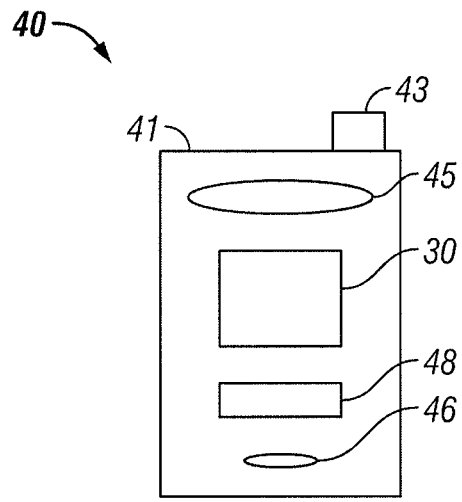
FIGS. 6A and 6B are system block diagrams illustrating an embodiment of a visual display device comprising a plurality of interferometric modulators.
Figure 6B:
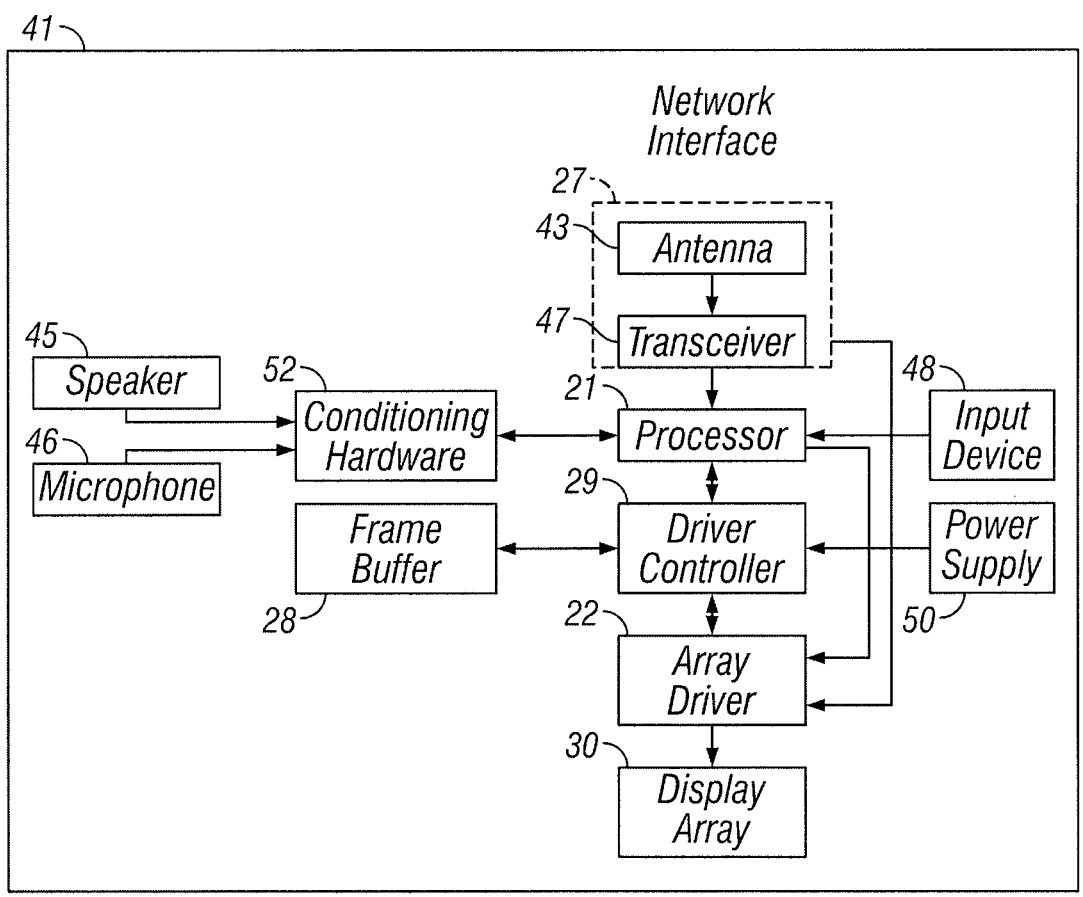

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell including a plastic solar cell, and solar-cell paint. In another embodiment, the power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
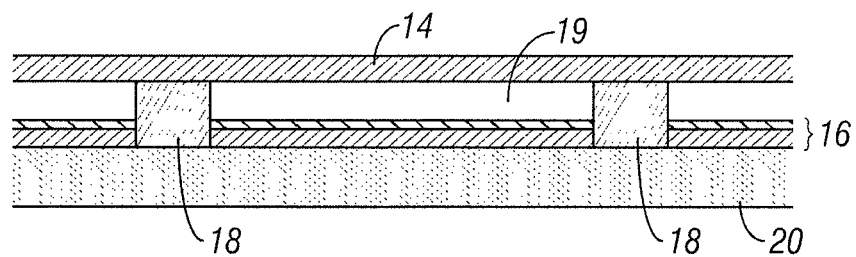
FIG. 7A is a cross section of the device of FIG. 1.
Figure 7B:
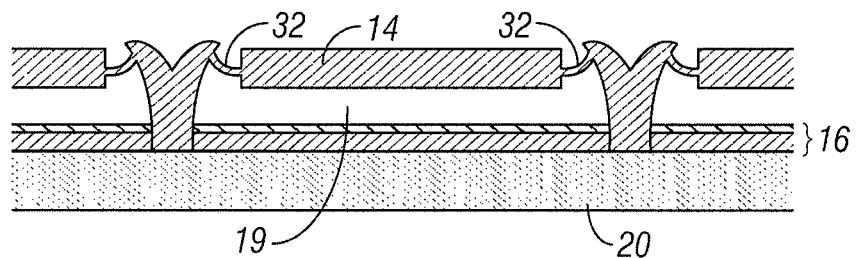
FIG. 7B is a cross section of an alternative embodiment of an interferometric modulator.
Figure 7C:
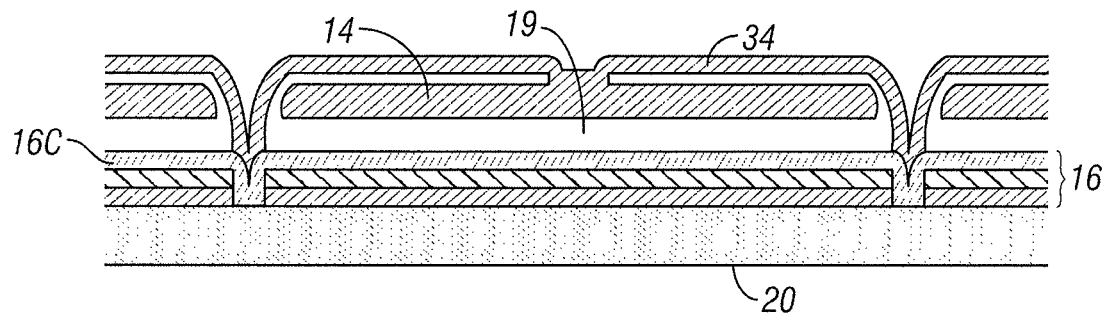
FIG. 7C is a cross section of another alternative embodiment of an interferometric modulator.
Figure 7D:
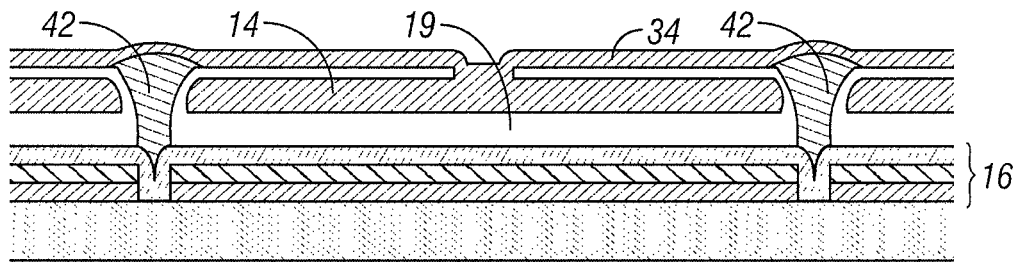
FIG. 7D is a cross section of yet another alternative embodiment of an interferometric modulator.
Figure 7E:
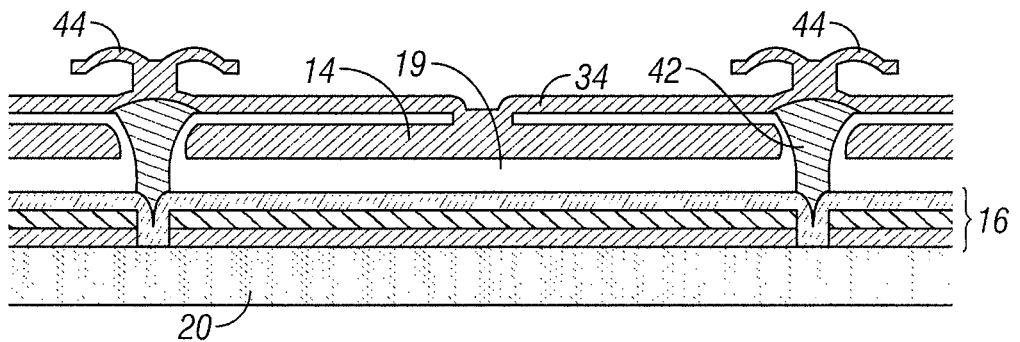
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as supports 18, which can take the form of posts, pillars, rails or walls. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the supports 18 are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIGS. 7A-7E, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8:
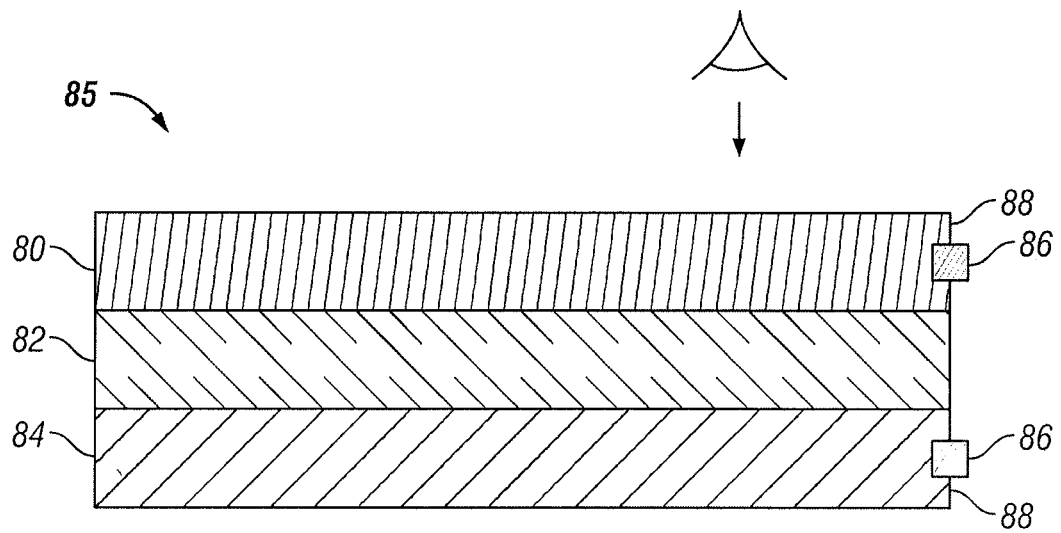
FIG. 8 is a schematic representation of a cross-section of a collection film and associated photovoltaic device overlying an array of display pixels and another such collection film underlying the array of display pixels.
Figure 9:
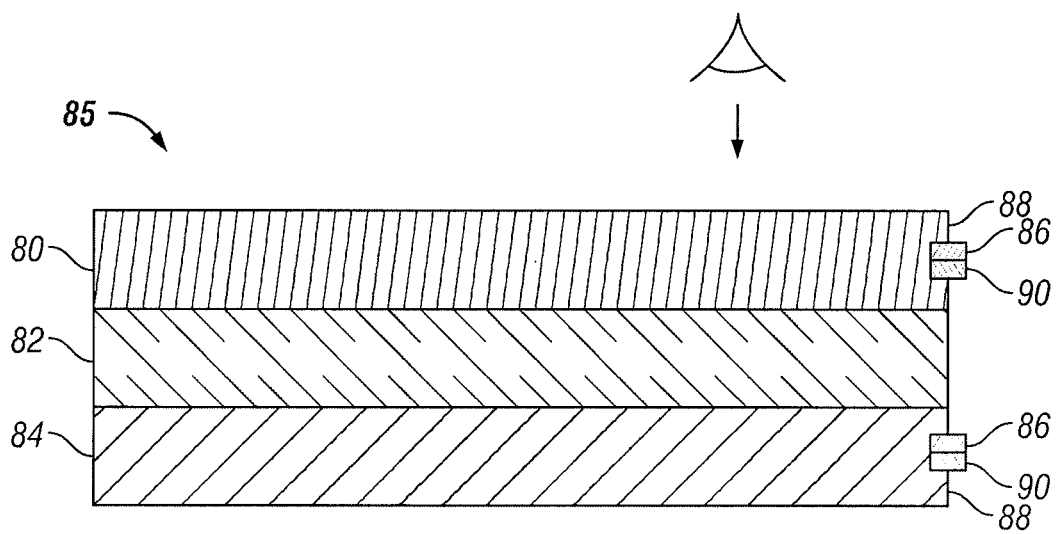
FIG. 9 is a schematic representation of a cross section of a collection film and associated photovoltaic device and light source overlying an array of display pixels and another such collection film underlying the array of display pixels.

In some embodiments as shown in FIGS. 8 and 9, a front collection film 80 is disposed over or on a front side of an array of display pixels 82. A back collection film 84 is disposed under or on a back side of the array of display pixels 82. The array of display pixels 82 may be reflective and take the form of a LCD, a MEMS device (e.g., an interferometric modulator or IMOD display), an electrophoretic device or any other type of display technology that reflects light from the front or viewing side. The array of display pixels 82 may be emissive and take the form of a liquid crystal display (LCD), a light-emitting diode (LED), an organic light-emitting diode (OLED), a field emission display (FED), a backlit microelectromechanical system (MEMS) device (e.g., a transreflective and backlit interferometric modulator display (IMOD)), or any other type of display technology that internally generates and emits light. As used herein, "emissive" display technologies include backlit technologies.

In certain embodiments, the display device 85 may be formed with only a front collection film 80. In other embodiments, the display device 85 may be formed with only a back collection film 84. FIG. 8 illustrates one embodiment in which the front and back collection films 80, 84 each have a photovoltaic (PV) device 86 disposed on an edge 88 of the collection films 80, 84. FIG. 8 is schematic and generally conveys the relative positions of collection films, PV devices and active displays, such that part of light received by the display or image area also is shunted to a PV device.

FIG. 9 illustrates another embodiment in which both a photovoltaic device 86 and a light source 90 are disposed on an edge 88 of the collection films 80, 84. In some embodiments, the photovoltaic device 86 and the light source 90 may be disposed next to each other. In other embodiments, the photovoltaic (PV) device 86 and light source 90 are disposed in different locations on the edge 88 of a collection film 80, 84. As with FIG. 8, the device may include either a front side collection film 80, a backside collection film 84, or both as shown. Similar to FIG. 8, part of the light from or to the image area of an active display is shunted to a PV device on the edge of an image area; additionally, the collection film turns some of the light from a light source at the edge towards the image area of the display array 82. Note that the PV device 86 and light source 90 need not be at the same edge or the same side of the edge 88 of the collection film 80, 84.

In the embodiments represented by FIG. 9, the collection films 80, 84 can have similar structures to those of FIG. 8. However, these films 80, 84 can also serve as illumination films to the extent light from the light source 90 travels in an opposite direction to light reaching the photovoltaic device 86. The collection films 80, 84 include light-turning features as will be better understood from FIGS. 11A-13B discussed below. The light source may comprise, e.g., a light emitting diode (LED).

The collection films 80, 84 each comprise two surfaces. The upper surface is configured to receive ambient light. The bottom surface is disposed below the upper surface. The collection film 80, 84 is bounded by edges 88 all around. Typically, the length and width of the collection film 80, 84 is substantially greater than the thickness of the collection film 80, 84. The thickness of the collection film 80, 84 may vary from, e.g., 0.5 to 10 mm. The area of the major surfaces of the collection film 80, 84 may vary from 0.01 to 10,000 cm$^2$. In some embodiments, the refractive index of the material comprising the collection film 80, 84 may be significantly higher than the surrounding media so as to guide a large portion of the ambient light within the collection film 80, 84 by total internal reflection (TIR).

Figure 10A:
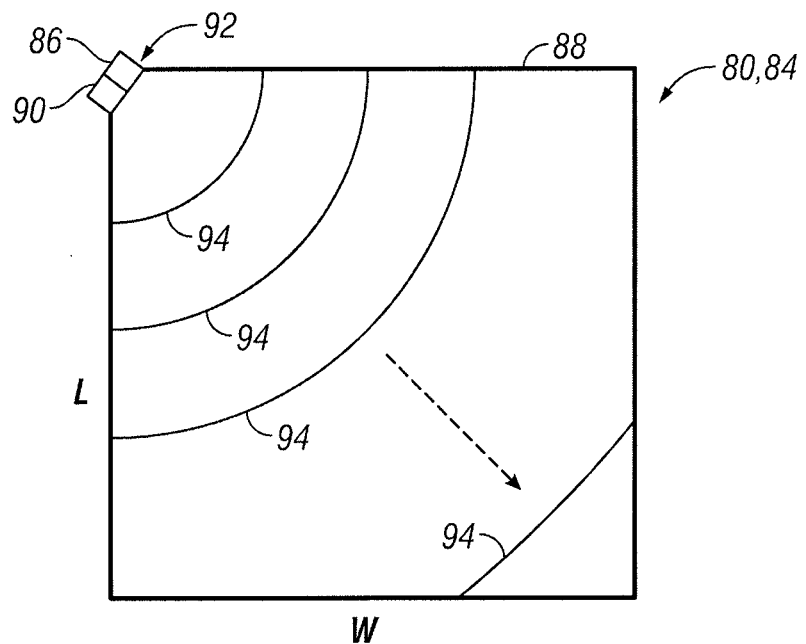
FIG. 10A is a top plan view of a collection film having light-turning features, with a photovoltaic device and light source disposed next to each other in one corner of the collection film.
Figure 10B:
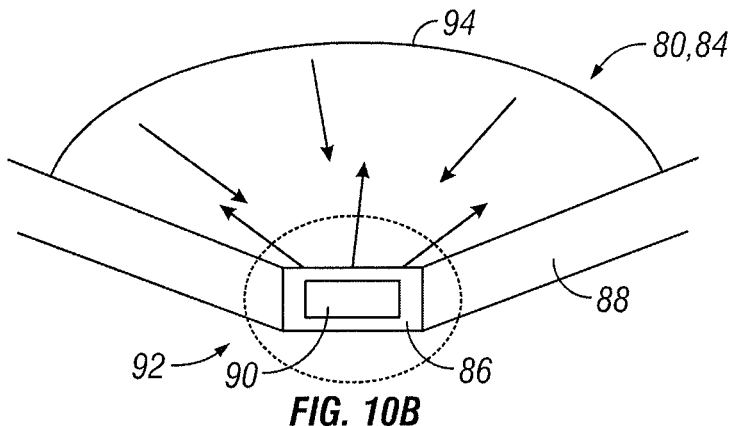
FIG. 10B is a schematic representation of a corner of one embodiment of a collection film with a photovoltaic device and light source.
Figure 10C:
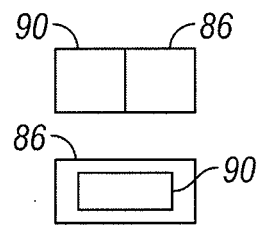
FIG. 10C is a schematic representation showing additional embodiments of photovoltaic device and light source configurations.

FIGS. 10A-10C illustrates various configurations for placing both the photovoltaic device 86 and light source 90 on the edge 88 of a collection film 80, 84. In some embodiments, the light source 90 may be omitted. In the embodiment as shown in FIG. 10A, the photovoltaic device 86 and light source 90 are disposed side-by-side at one corner 92 of the collection film 80, 84. The collection film 80, 84 comprises light-turning features 94, illustrated schematically by the arcs on the surface of the collection film 80, 84. The light-turning features may be prismatic, diffractive, holographic, or any other mechanism for turning light from a direction incident upon the upper or lower surface of the collection film 80, 84 to a direction laterally toward the edge 88 of the collection film 80, 84. In some embodiments, the photovoltaic device 86 and/or light source 90 may be disposed centrally along one side of the edge 88, rather than the corner 92 of the collection film 80, 84. While FIG. 10A demonstrates a photovoltaic device 86 and light source 90 that are placed next to one another, the photovoltaic device 86 and light source 90 may also be concentric or overlapping, as seen in FIGS. 10B and 10C, or may be arranged in different locations on the edges 88 of the collection film 80, 84, for example across from one another. In some embodiments, the collection film 80, 84 has a plurality of photovoltaic devices 86 and/or light sources 90 placed in various locations on edges 88 of the collection film 80, 84.

FIGS. 11A-13B illustrate examples of collection films having light-turning features that can be used for collection of light and photovoltaic conversion, or both collection and illumination of display devices 85.

Figure 11A:
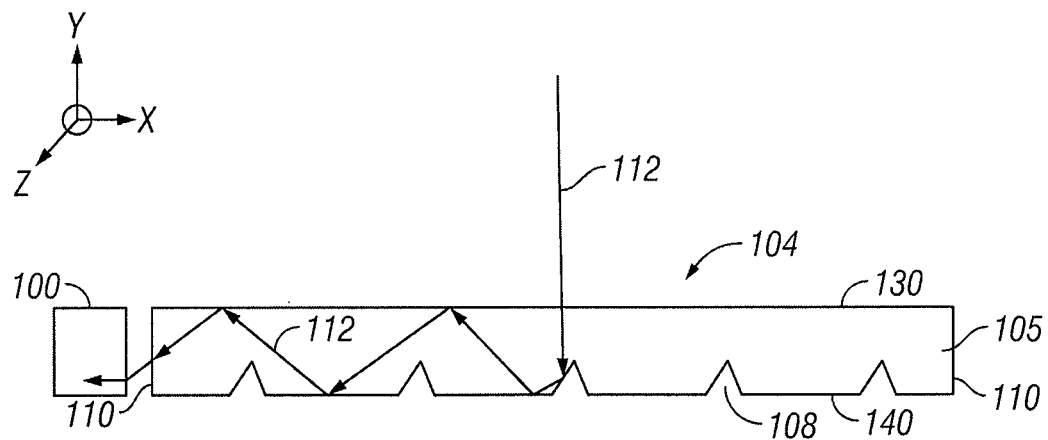
FIG. 11A is a schematic cross-sectional side view of a prismatic collection film comprising a plurality of prismatic features to collect and guide light to a photovoltaic device.

One embodiment of a prismatic collection film used to operatively couple ambient light into a photovoltaic device is shown in FIG. 11A. The prismatic light guiding collector is based on the principle of reciprocity. In other words, light can travel in a forward and backward direction along the path between the surface of the prismatic collection film and the edges. FIG. 11A illustrates the side view of an embodiment comprising a collection film 104 disposed with respect to a photovoltaic device 100. In some embodiments, the collection film 104 comprises a substrate 105 and a plurality of prismatic features 108 formed thereon or therein. The collection film 104 may comprise a top surface 130 and a bottom surface 140 with a plurality of edges 110 therebetween. Light 112 incident on the collection film 104 may be redirected into the collection film 104 by the plurality of prismatic features 108 and guided laterally within the collection film 104 by multiple total internal reflections at the top and bottom surfaces. The collection film 104 may comprise optically transmissive material that is transparent to radiation at one or more wavelengths to which the photovoltaic device is sensitive. For example in one embodiment, the collection film 104 may be transparent to wavelengths in the visible and near infra-red region. In other embodiments, the collection film 104 may be transparent to wavelengths in the ultra-violet or infra-red regions. The collection film 104 may be formed from rigid or semi-rigid material such as glass or acrylic so as to provide structural stability to the embodiment. Alternatively the collection film 104 may be formed of flexible material such as a flexible polymer.

In one embodiment, as shown in FIG. 11A, the light-turning features in the form of prismatic features 108 are positioned on the bottom surface 140 of the substrate 105 or away from the light source. The prismatic features 108 in general are elongated grooves formed on the bottom surface 140 of the substrate 105. The grooves may be filled with an optically transmissive material. The prismatic features 108 may be formed on the bottom surface of the substrate 105 by molding, embossing, etching or other alternate techniques. Alternatively the prismatic features 108 may be disposed on a film which may be laminated on the bottom surface of the substrate 105. In some embodiments comprising a prismatic film, light may be guided within the prismatic film alone. In such embodiments, the substrate 105 may provide structural stability alone. The prismatic features 108 may comprise a variety of shapes. For example, the prismatic features 108 may be linear v-grooves, or slits. Alternately, the prismatic features 108 may comprise curvilinear grooves or non-linear shapes.

Figure 11B:
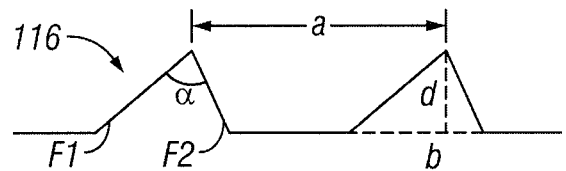
FIG. 11B is another schematic sectional view of a prismatic collection film comprising a plurality of prismatic features to collect and guide light to a photovoltaic device.

FIG. 11B shows an enlarged view of the prismatic features in the form of a linear v-groove 116. The v-groove 116 comprises two planar facets F1 and F2 arranged with an angle α between them as shown in FIG. 11B. The angular separation α between the facets may depend on the refractive index of the collection film 104 or the surrounding mediums and may vary from 15 degrees to 120 degrees. In some embodiments, the facets F1 and F2 may be of equal lengths. In the illustrated, asymmetrical embodiment, the length of one of the facets is greater than the other. The distance between two consecutive v-grooves 'a' may vary between 0.01 to 0.5 mm. The width of the v-groove, indicated by 'b', may vary between 0.001 to 0.100 mm while the depth of the v-groove indicated by 'd' may vary between 0.001 to 0.5 mm.

Figure 11C:
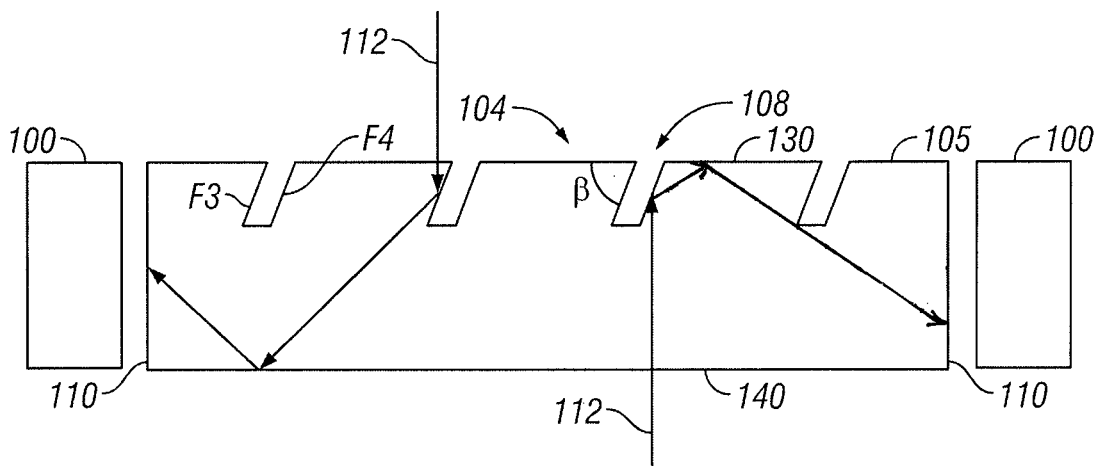
FIG. 11C is another schematic sectional view of a prismatic collection film comprising a plurality of prismatic slits to collect and guide light to a photovoltaic device.

FIG. 11C shows an enlarged view of the prismatic features in the form of asymmetric slits 108. The slits 108 comprise two substantially parallel planar facets F3 and F4 arranged at an angle β with the collection film surface. The angle β between the collection film surface and slits may depend on the refractive index of the collection film 104 or the surrounding mediums and may vary from 5 degrees to 70 degrees. The planar facet F3 redirects light from the front collection film surface 130 laterally toward one edge 110 of the collection film 104 by multiple internal reflections at front and back collection film surfaces 130, 140. The planar facet F4 redirects light 112 from the back collection film surface 140 to an opposite edge 110 of the collection film 104 by multiple internal reflections on the front and back collection film surfaces 130, 140.

Referring to FIGS. 11A and 11C, a photovoltaic device 100 is disposed laterally with respect to the collection film 104 adjacent an edge 110 of the film 104. The photovoltaic device 100 is configured and oriented to receive light redirected through the collection film 104 by the prismatic features 108. The photovoltaic device 100 may comprise a single or a multiple layer p-n junction and may be formed of silicon, amorphous silicon or other semiconductor materials such as Cadmium telluride. In some embodiments, the photovoltaic device 100 may be based on photoelectrochemical cells, polymer or nanotechnology. The photovoltaic device 100 may also comprise thin multispectrum layers. The multispectrum layers may further comprise nanocrystals dispersed in polymers. Several multispectrum layers may be stacked to increase efficiency of the photovoltaic device 100. FIGS. 11A and 11B show an embodiment wherein the photovoltaic device 100 is disposed along one edge 110 of the collection film 104 (for example, to the left of the collection film 104). However, another photovoltaic device may be disposed at another edge of the collection film 104 as well (for example, to the right of the collection film 104). Multiple photovoltaic devices may be disposed at opposite edges of the collection film 104 (for example, to the left and the right of the collection film 104), as shown in FIG. 11C. Other configurations of positioning the photovoltaic device 100 with respect to the collection film 104 are also possible.

Light that is incident on the upper surface of the collection film 104 is transmitted through the collection film 104 as indicated by the light path 112. Upon striking a facet of the prismatic feature 108, the light is total internally reflected by multiple reflections from the upper and bottom surfaces 130, 140 of the collection film 104. After striking the edge 110 of the collection film 104, the ray of light exits the collection film 104 and is optically coupled to the photovoltaic device 100. Lenses or light pipes may be used to optically couple light from the collection film 104 to the photovoltaic device 100. In one embodiment, for example, the collection film 104 may be devoid of prismatic features 108 towards the end closer to the photovoltaic device 100. The portion of the collection film 104 without any prismatic features may function as a light pipe. The amount of light that can be collected and guided through the collection film will depend on the geometry, type and density of the prismatic features. The amount of light collected will also depend upon the refractive index of the light guiding material, which determines the numerical aperture.

Light is thus guided through the collection film 104 by total internal reflection (TIR). While any particular ray may be oriented at angles to the upper or lower surfaces, the net redirection is from a direction incident to a major (top or bottom) surface of the film to a lateral direction, toward the edges 110 of the film 104, generally parallel to the surface on which light is incident. The guided light may suffer losses due to absorption in the collection film and scattering from other facets. To reduce this loss in the guided light, it is desirable to limit the lateral length of the collection film 104 to tens of inches or less so as to reduce the number of reflections. However, limiting the length of the collection film 104 may reduce the area over which light is collected. Thus in some embodiments, the length of the collection film 104 may be increased to greater than tens of inches. In some other embodiments, optical coatings may be deposited on the surface of the collection film 104 to reduce Fresnel loss.

Figure 11D:
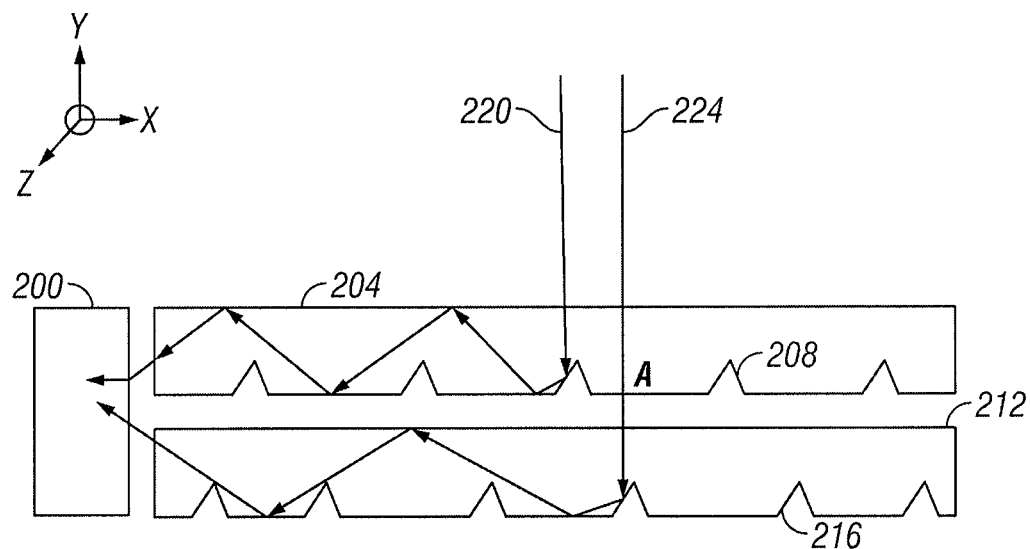
FIG. 11D illustrates an embodiment comprising two layers of prismatic collection films stacked with staggered features to collect and guide light to a photovoltaic device with greater efficiency.

When the ray of light strikes the part of the collection film 104 that is devoid of the prismatic feature 108, which will typically be the majority of the film surface, it can be transmitted through the collection film and not be turned into the collection film. In the embodiments described below where it is desirable to allow a significant portion of the incident light through the film, the transmitted light can illuminate the active display. Nevertheless, it may be desirable to tune the amount of light turned to increase collection of the photovoltaic device 100. To increase the amount of light shunted toward the photovoltaic device 100, it may be advantageous to stack several collection film layers comprising prismatic features wherein the prismatic features are offset with respect to each other as illustrated in FIG. 11D. FIG. 11D illustrates an embodiment comprising a first collection film layer 204 with prismatic features 208 and a second collection film layer 212 with prismatic features 216. A photovoltaic device 200 is disposed laterally with respect to the two collection film layers 204 and 212. The prismatic features 208 and 216 are either designed to be offset with respect to each other or randomized to have a high likelihood of nonalignment of the light-turning features. Light ray 220 is turned and guided through the first collection film 204 as described above. Light ray 224 which passes through the first collection film 204 at point A is turned and guided through the second collection film 212. Offsetting the prismatic features 208 and 216 in this manner reduces the spaces between the features and increases the density of the prismatic features. Offsetting the features may increase the amount of light optically coupled to the photovoltaic device thereby increasing the electrical output of the photovoltaic device (at the expense of transmitted light). Since the collection film layers 204, 212 can be thin, it is possible to stack multiple collection film layers and increase the amount of light coupled to the PV cell. The number of layers that can be stacked together depends on the size and/or thickness of each layer and the Fresnel loss at the interface of each layer, in addition to the tolerable losses of transmitted light for the desired application (e.g., viewing a display device through the layers). In some embodiments, two to ten collection film layers may be stacked together.

An advantage of using a prismatic light guiding plate, sheet or film to collect, concentrate and direct light towards a photovoltaic device is that fewer photovoltaic devices may be needed to achieve the desired electrical output. Thus, this technique may possibly reduce the cost of generating energy with photovoltaic devices. Another advantage is the ability to collect light for generating power without undue reduction in transmission of light to a reflective display or from any type of display.

Figure 12:
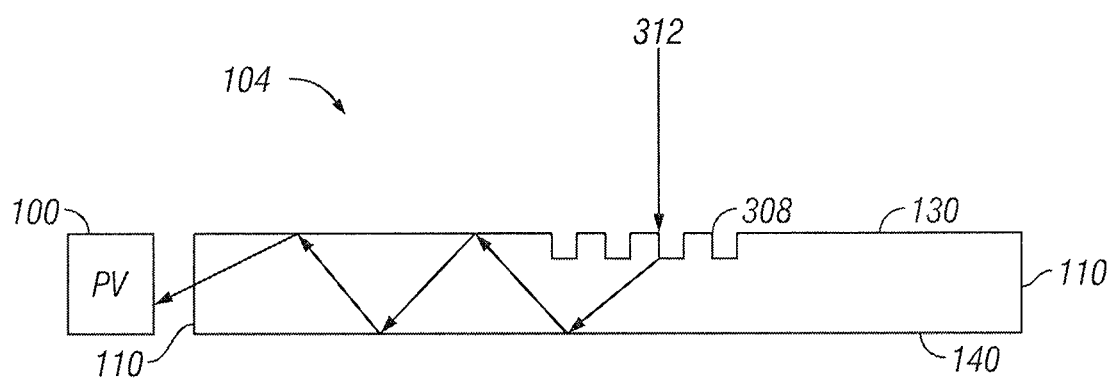
FIG. 12 is a schematic representation of a collection film including diffractive turning features.

FIG. 12 illustrates another collection film, wherein the turning features comprise diffractive features 308 rather than prismatic features. In various preferred embodiments, the diffractive features 308 are configured to redirect light (e.g., ray 312) incident on the collection film 104 at an angle through which light propagates within the collection film 104 out the edge 110 of the collection film 104 and into the photovoltaic device 100. Light may propagate along the length of the collection film 104, for example, via total internal reflection at grazing angles, e.g., of about 40° or more (as measured from the normal to surfaces of the collection film 104). This angle may be at or above the critical angle established by Snell's law. The diffracted ray 312 is redirected near normal to the length of the collection film 104. The diffractive features 308 may comprise surface or volume diffractive features. The diffractive features 308 may be included on a diffractive turning film on the first side 130 of the collection film 104. The diffractive features may comprise holographic features. Likewise the diffractive turning film may comprise a hologram or holographic film in some embodiments. Depending upon relative index of refraction or reflectivity of materials, the diffractive microstructure may be on top, bottom, or a side of the collection film 104.

Figure 13A:
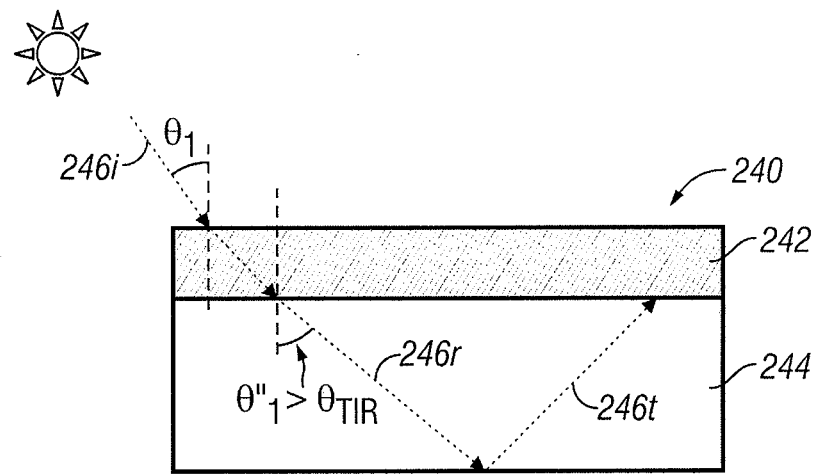
FIG. 13A schematically illustrates a light-turning feature comprising transmission hologram disposed on the upper surface of a collection film.
Figure 13B:
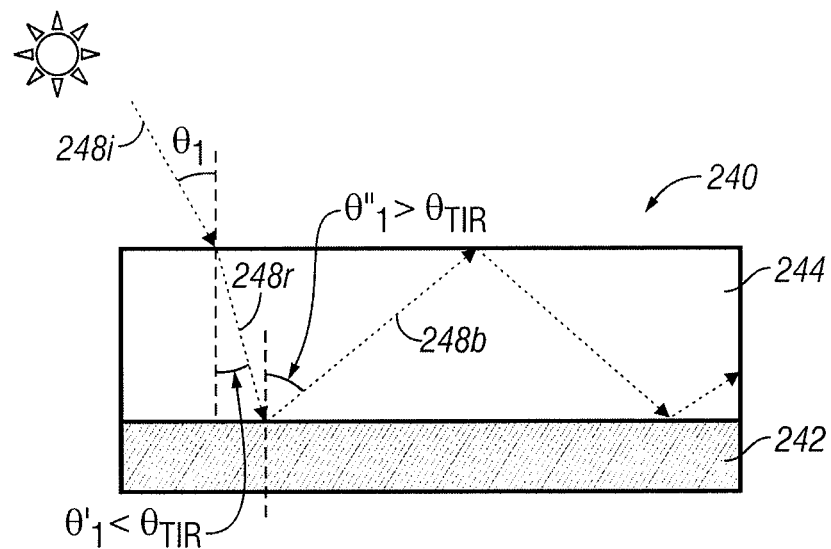
FIG. 13B schematically illustrates a light-turning feature comprising reflection hologram disposed on the lower surface of a collection film.

FIGS. 13A and 13B illustrate embodiments of a collection film 240 comprising another type of light-turning element 242. The light-turning element 242 may be a micro-structured thin film. In some embodiments, the light-turning element 242 may comprise volume or surface diffractive features or holograms. The light-turning element 242 may be a thin plate, sheet or film. The thickness of the light-turning element 242 may range from approximately 1 μm to approximately 100 μm in some embodiments but may be larger or smaller. In some embodiments, the thickness of the light-turning element or layer 242 may be between 5 μm and 50 μm. In some other embodiments, the thickness of the light-turning element or layer 242 may be between 1 μm and 10 μm. The light-turning element 242 may be attached to a layer on substrate 244 of the collection film 240 by an adhesive. The adhesive may be index-matched with the material comprising the substrate 244. In some embodiments, the adhesive may be index matched with the material comprising the light-turning element 242. In some embodiments, the light-turning element 242 may be laminated on the substrate 244 to form the collection film 240. In certain other embodiments, volume or surface diffraction features or holograms may be formed on the upper or lower surface of the substrate 244 by deposition, or other processes.

The volume or surface diffractive elements or holograms can operate in transmission or reflection mode. The transmission diffractive element or holograms generally comprise optically transmissive material and diffract light passing therethrough. Reflection diffractive elements and holograms generally comprise a reflective material and diffract light reflected therefrom. In certain embodiments, the volume or surface diffractive elements/holograms can be a hybrid of transmission and reflection structures. The diffractive elements/holograms may include rainbow holograms, computer-generated diffractive elements or holograms, or other types of holograms or diffractive optical elements. In some embodiments (e.g., on the back side of displays), reflection holograms may be preferred over transmission holograms where a high proportion of incident light should be shunted to the photovoltaic devices (and from light sources, in some embodiments) because reflection holograms may be able to collect and guide white light better than transmission holograms. In those embodiments (e.g., on the front side of displays), where higher transparency is desired, transmission holograms may be used. Transmission holograms may be preferred over reflection holograms in embodiments that comprise multiple layers. In certain embodiments described below, stacks of transmissive layers are particularly useful to increases optical performance. As noted, transmissive layers may also be useful for the embodiments where the collection film lies over the front of a display, so that a high proportion of incident light can pass through the collection film to and from the display beneath the collection film.

One possible advantage of the light-turning element 242 is explained below with reference to FIGS. 13A and 13B. FIG. 13A shows an embodiment wherein the light-turning element 242 comprises a transmission hologram and is disposed on an upper surface of the substrate 244 to form the collection film 240. A ray of ambient light 246i is incident on the top surface of the light-turning element 242 at an angle of incidence $\theta_1$. The light-turning element 242 turns or diffracts the incident ray of light 246. The diffracted ray of light 246r is incident on the substrate 244, such that the angle of propagation of ray 246r in the substrate 244 is $\theta''_1$ which is greater than $\theta_{TIR}$. Thus the ray of light 246i which would have been transmitted out of the collection film 240 and would not be guided laterally within the substrate 244 in the absence of the light-turning element 242 is now collected and guided laterally within the collection film 240 in the presence of the light-turning element 242. The light-turning element 242 can therefore increase the collection efficiency of the collection film 240. Conversely, light from a light source at the edge of the film 240 is more likely turned toward the upper surface.

FIG. 13B illustrates an embodiment wherein the light-turning element 242 comprises a reflection hologram and is disposed on the bottom surface of the substrate 244. Ray 248 is incident on the upper surface of the collection film 240 at angle $\theta_1$ such that the angle of refraction of ray 248 is $\theta_1'$. The refracted ray 248r upon striking the light-turning element 242 is reflected by the light-turning element 242 as ray 248b at an angle $\theta_1''$ which is greater than the critical angle $\theta_{TIR}$ for the substrate 244. Since the angle $\theta_1''$ is greater than the critical angle $\theta_{TIR}$, the ray 248b is subsequently guided within the collection film 240 through multiple total internal reflections. Thus the ray of light 248i that would not have been guided by the substrate 244 is now guided within the collection film 240 because of the presence of the light-turning element 242.

Conversely, light from a light source at the edge of the film 240 is more likely turned toward the upper surface.

Figure 14:
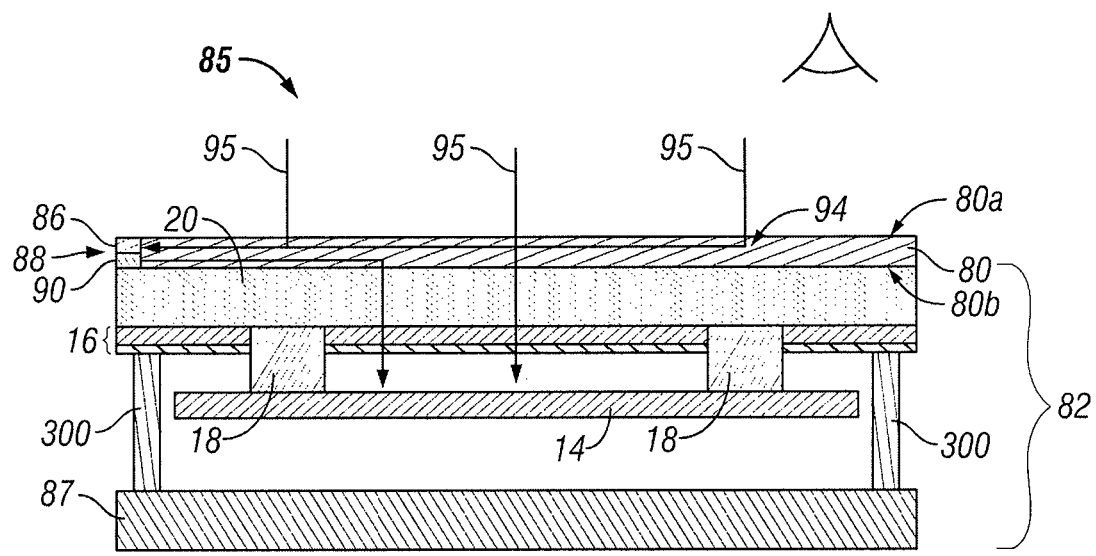
FIG. 14 is a schematic cross-section of one embodiment of a reflective interferometric modulator display having a collection film on the front side.

FIG. 14 illustrates one embodiment of a display device 85 in which a collection film 80 is disposed on the front display surface of an array of active pixels for a reflective display 82. In the illustrated embodiment, the reflective display 82 comprises an active MEMS array, and more particularly an active interferometric modulator (IMOD) with individually addressable pixels arranged in an array, as disclosed above with respect to FIGS. 1-7E. In other embodiments, the reflective display 82 can comprise LCD, DLP or electrophoretic active display technologies. The reflective display 82 shown in FIG. 14 includes a front display surface on which the collection film 80 is affixed. The front display surface is connected to the backplate 87 by spacers 300 and/or a seating frit around the array of display pixels 82. The array 82 includes a substrate 20, optical stacks 16, which include stationary (transparent) electrodes, and moveable electrodes or mirrors 14, connected to the substrate 20 by supports 18. For purposes of illustration, IMOD arrays in FIGS. 14 and 15 are represented schematically by a single IMOD.

In the embodiment of FIG. 14, the front collection film 80 has a front collection film surface 80a and a back collection film surface 80b and at least one edge 88. A photovoltaic device 86 is disposed on the edge 88 of the collection film 80 and a light source 90 is located either next to the photovoltaic device 86 or at another edge location. The front collection film surface 80a receives ambient light 95. The light-turning features 94 of the collection film 80 direct the ambient light 95 towards the edge 88 of the film 80 to be received and converted to electrical energy by the photovoltaic device 86. The light source 90 emits light which is turned by the light-turning features 94 towards the reflective display 82 to illuminate the display 82 in the absence of sufficient ambient light 95, or to brighten the reflective display 82 in conjunction with the ambient light 95. In some embodiments, the light source 90 may be omitted.

Figure 15:
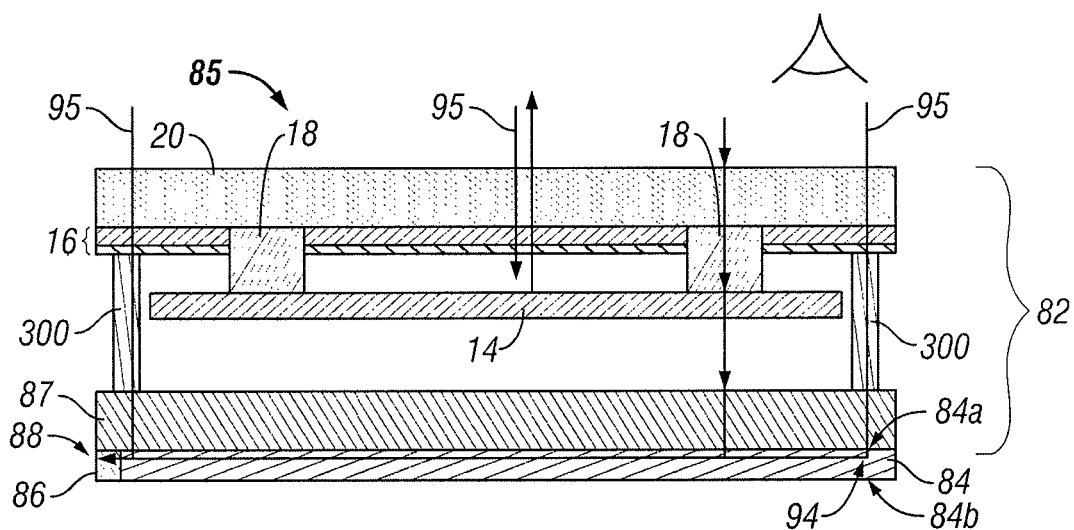
FIG. 15 is a schematic cross-section of another embodiment of a reflective interferometric modulator display having a collection film on the back side.

FIG. 15 illustrates another embodiment of a reflective display device 85, where like elements are indicated by like reference numbers, in which the collection film 84, having a front collection film surface 84a and a back collection film surface 84b, is disposed on the back of an array of active pixels for the display 82. Ambient light 95 passes through the supports 18 or other transparent, inactive regions between the active regions of the display 82 to be received by the front collection film surface 84a of the back collection film 84. The light-turning features 94 of the collection film 84 redirect the light 95 toward the edge 88 of the collection film 84 to be converted into electrical energy by the photovoltaic device 86.

Figure 16:
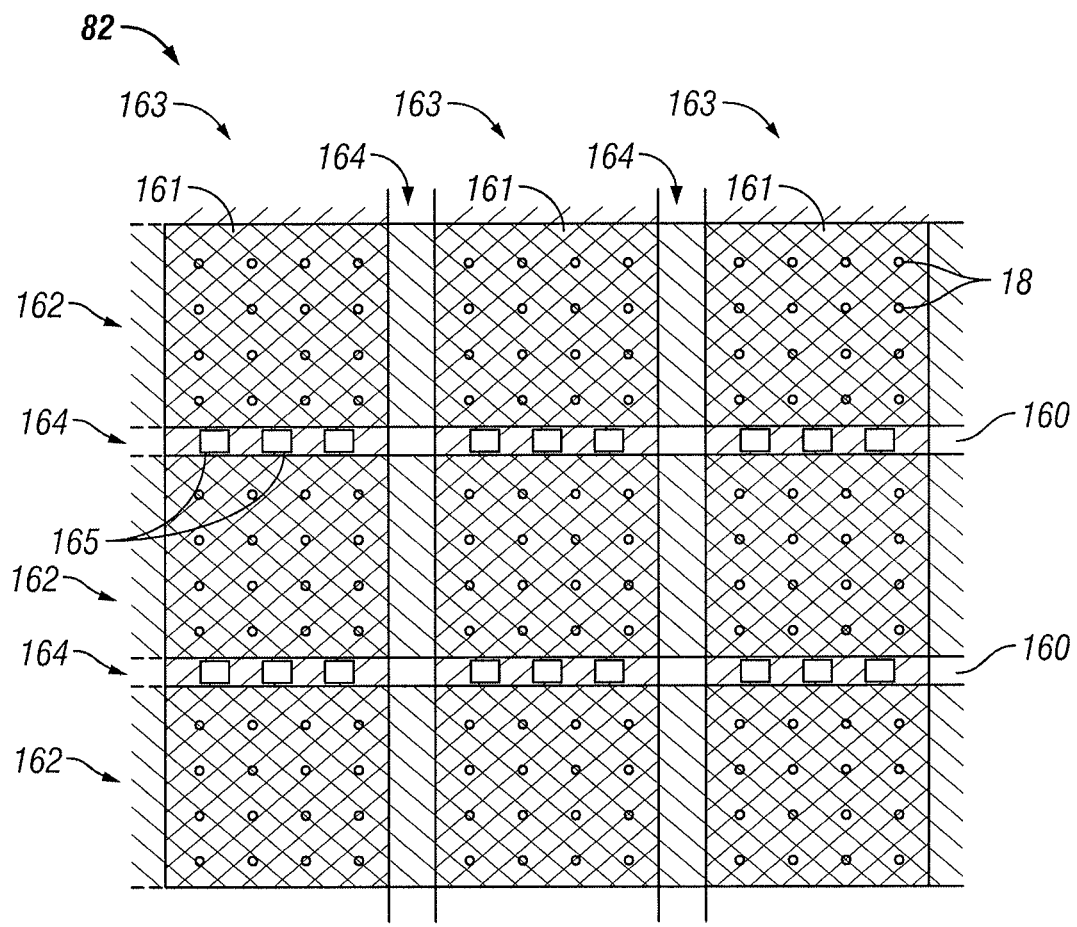
FIG. 16 is a schematic plan view of an array of active display pixels arranged in rows and columns.

FIG. 16 illustrates a plan view of an array of pixels 161 for a reflective display 82. The display pixels 161 are arranged in rows 162 and columns 163. The area between the rows 162 and columns 163, or the inactive regions, include supports 18 and gaps 164. Typically, inactive regions such as the supports 18 and gaps 164 are masked off with a black mask in order to minimize reflections from these areas, minimize the contrast ratio of the display pixels 161, and improve performance. In some embodiments of the present invention in which the display pixels 161 are reflective, light can pass through to a back collection film 84 through the posts 18 and gaps 164 between rows 162 and columns 163 of the reflective display 82. The turning features can be aligned with the inactive regions in order to maximize the collection or illumination of light, whether the collection film is on the front or backside of the display 82. The black mask may therefore be eliminated as the light that would typically be absorbed by the black mask is instead shunted to the photovoltaic device 86 on the edge of the collection films 80, 84. Reflections and loss of contrast from these areas are thus reduced, while the light received in these areas can be used to generate power. By eliminating the black mask material, black mask deposition and patterning steps, the overall cost of manufacturing the display device 85 may be reduced. Where the collection film 84 is on the backside (FIG. 15), openings 165 may be formed in electrode strips in the gaps 164 between rows or columns, to increase the transmission of light. Because FIG. 16 illustrates an IMOD example in which the row electrodes 162 are transparent, only the reflective column electrodes 163 need to have openings 165 in locations where the column electrodes 163 cross gaps 164 between rows 162. The column electrodes 163 of FIG. 16 correspond to the movable electrodes or mirrors 14 of FIGS. 14 and 15, while the row electrodes 162 of FIG. 16 correspond to the optical stacks 16 (incorporating stationary transparent electrodes) of FIGS. 14 and 15.

Figure 17A:
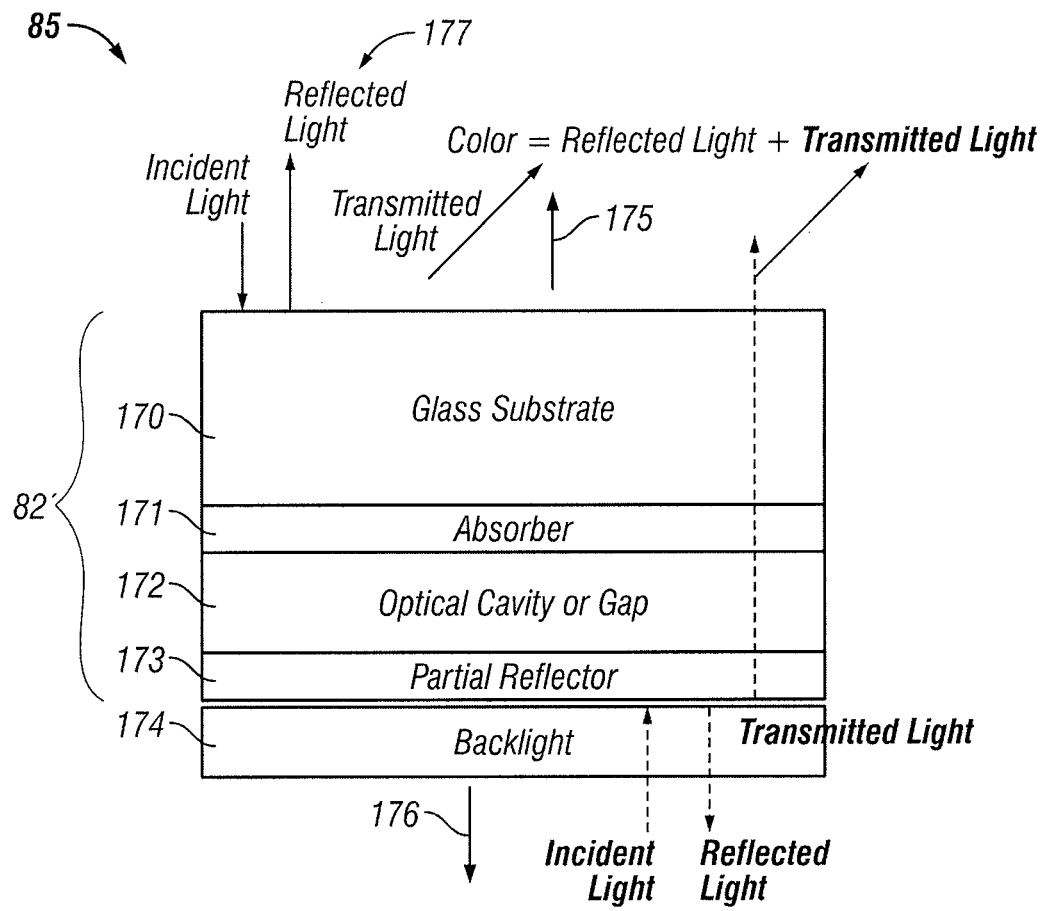
FIG. 17A is a schematic cross-section of a transflective interferometric modulator (IMOD) display incorporating a backlight.

FIG. 17A schematically illustrates a transflective display 82' in which some light passes through the display 82' and some light is reflected off of pixels of the display 82' in actively altered images. In certain embodiments, the percentage of visible light that passes through the active array of display pixels ranges from about 5% to about 50%. The display 82' illustrated in FIG. 17 is an array of transparent interferometric modulators (IMODs) represented in the drawing by a single IMOD that comprises a substrate 170, an absorber layer 171, a optical resonant cavity 172, a partial reflector layer 173, and a light source 174. The substrate 170 is at least partially optically transparent. The absorber layer 171 is positioned under the substrate 170, and the absorber layer 171 is partially optically transmissive. The reflector layer 173 is positioned under the substrate 170 and is spaced from the absorber layer 171 with the absorber layer 171 located between the substrate 170 and the reflector layer 173. The partial reflector 173 can move in the optical cavity 172 in accordance with the IMOD descriptions above. The reflector layer 173 is also partially reflective and partially transmissive. The light source 174 is positioned relative to the substrate 170 such that the absorber layer 171 and the reflector layer 173 are located between the substrate 170 and the light source 174. Although not shown, a backplate may be positioned between the partial reflector 173 and the backlight 174.

In certain embodiments, light emitted from the display 82' in a first direction 175 comprises a first portion of light, a second portion of light, and a third portion of light. The first portion of light is incident on the substrate 170 transmitted through the substrate 170, transmitted through the absorber layer 171, reflected by the reflector layer 173, transmitted through the absorber layer 171, transmitted through the substrate 170, and emitted from the substrate 170 in the first direction 175. The second portion of light is incident on the substrate 170, transmitted through the substrate 170, reflected by the absorber layer 171, transmitted through the substrate 170, and emitted from the substrate 170 in the first direction 175. The third portion of light is from the light source 174 and is incident on the reflector layer 173, transmitted through the reflector layer 173, transmitted through the absorber layer 171, transmitted through the substrate 170, and emitted from the substrate 170 in the first direction 175.

In certain embodiments, the substrate 170 comprises a glass or plastic material. In certain embodiments, the absorber layer 171 comprises chromium. In certain embodiments, the reflector layer 173 comprises a metal layer (e.g., aluminum layer having a thickness of less than 300 Angstroms). The transmissivity of the reflector layer 173 in certain embodiments is dependent on the thickness of the reflector layer 173.

For the illustrated transflective IMOD, at least one of the absorber layer 171 and the reflector layer 173 is selectively movable so as to change the spacing between the absorber layer 171 and the reflector layer 173 so that two optical states are generated selectively using the principles of interferometrics. In certain embodiments, the display device 85 comprises actuatable elements (e.g., a pixel or sub-pixel) of a display system.

In certain embodiments, the first portion of light and the second portion of light interfere to produce light having a first color, in accordance with normal IMOD operation discussed with respect to FIGS. 1-7E. The first color depends on the size of the optical cavity, which can be changed between at least two states.

In certain embodiments, the light source 174 can selectively alter the color of the interferometric sum of the first and second portions of light. The light source 174 can be turned on to create a third state producing a different color. Yet a different color can be produced in the absence of ambient light.

In certain embodiments, the display device 85 is viewable from both the first direction 175 and in a second direction 176 generally opposite to the first direction. For example, the display device 85 of certain such embodiments can be viewed from a first position on a first side of the display device 85 and from a second position on a second side of the display device 85. In certain embodiments, the light emitted from the display device 85 in the second direction 176 comprises a fourth portion of light, a fifth portion of light, and a sixth portion of light. The fourth portion of light in certain embodiments is incident on the substrate 170, transmitted through the substrate 170, transmitted through the absorber layer 171, transmitted through the reflector layer 173, and emitted from the display device 85 in the second direction 176. The fifth portion of light in certain embodiments is incident on the reflector layer 173, transmitted through the reflector layer 173, reflected from the absorber layer 171, transmitted through the reflector layer 173, and emitted from the display device 85 in the second direction 176. The sixth portion of light in certain embodiments is incident on the reflector layer 173, reflected from the reflector layer 173, and emitted from the display device 85 in the second direction 176. In certain embodiments, the fifth portion of light comprises light emitted by the light source 174 and the sixth portion of light comprises light emitted by the light source 174. As with the front side, additional color states can be visible from the back or second direction 176, depending upon whether the backlight 174 is on or off, and whether ambient light is present.

Figure 17B:
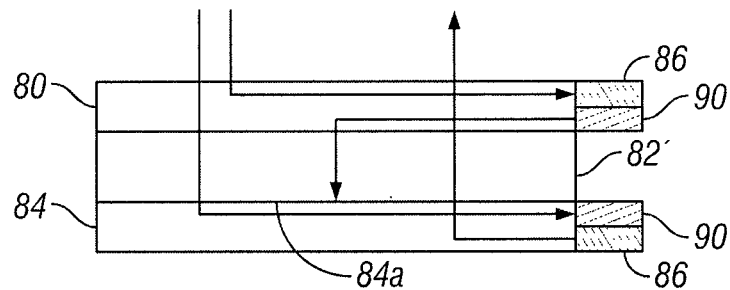
FIG. 17B is a schematic cross-section of a transflective IMOD display where the backlight is provided by a collection/illumination film having turning features.

Referring to FIG. 17B, the backlight of FIG. 17A can be replaced by a back collection film 84 that receives light from a light source 90 (e.g., injected along an edge 88 of the collection film 84), guides the light along the collection film 84, and redirects and emits the light towards the pixels of the transflective display 82' thereby providing backside illumination. The collection film 84 can include turning features located within or on the collection film 84 which disrupt the propagation of light within the collection film 84 to be uniformly emitted across a front surface 84a of the back collection film 84 towards a front surface of the display 82'. Furthermore, additional color states can be produced by front lighting from the light source 90 in conjunction with a front collection/illumination film 80 on the front side of the transflective IMOD display 82'. Photovoltaic devices 86 can be provided on either front side or backside collection films 80, 84.

Figure 18:
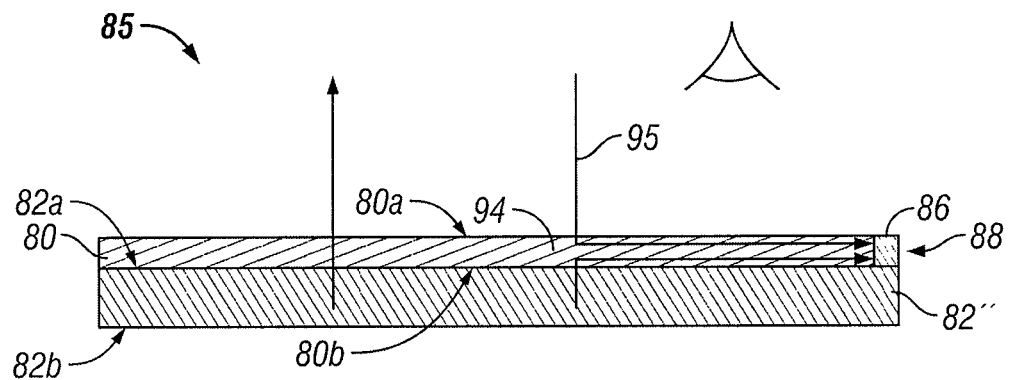
FIG. 18 is a schematic cross-section of an embodiment of an emissive display device having a collection film on the front side.

FIG. 18 illustrates an embodiment of a display device 85 having a front collection film 80 disposed over the front display surface 82a of an emissive display 82". The pixels of the display 82" are emissive such as LCD, LED, OLED, FED technologies, or the display 82" includes a back light. In some embodiments, the display pixel is transflective, such as the backlit IMODs of FIG. 17A or 17B, allowing some light to pass through the active pixel regions of the display 82".

Ambient light 95 is received by the front collection film surface 80a of the front collection film 80 and redirected via the light-turning features 94 to the edge 88 of the collection film 80 to be converted into electrical energy by the photovoltaic device 86. The light from the emissive display 82" emits light which is received by the back collection film surface 80b of the front collection film 80. The light-turning features 94 redirect the light towards the edge 88 of the collection film 80 to be converted into electrical energy by the photovoltaic device 86. The light from the emissive display 82" emits light that passes between turning features 84 can illuminate the display device 85.

Figure 19:
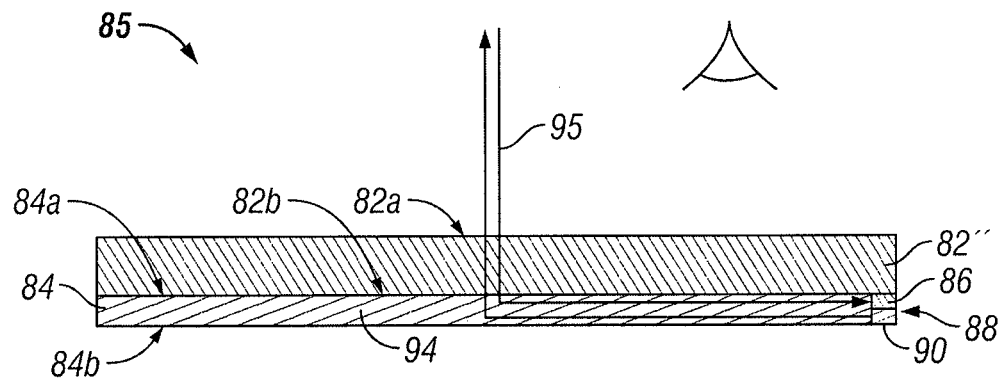
FIG. 19 is a schematic cross-section of another embodiment of an emissive display device having a collection film on the back side.

FIG. 19 illustrates an embodiment of a display device 85 in which a back collection film 84 is disposed under an emissive display 82". As illustrated, the back collection film 84 is coupled to a light source 90 and functions as both a light collection unit and a backlight, similar to the transflective IMOD 82' of FIG. 17B. Emissive displays 82" incorporating the backlighting of FIG. 19 can use any backlit active display technology, such as backlit LCDs.

As seen in FIG. 19, ambient light 95 passes through the display 82" and is redirected from the front collection film surface 84a of the back collection film 84 via the light-turning features 94 to the edge 88 of the back collection film 84 to be converted into electrical energy by the photovoltaic device 86. The light source 90 is disposed on the edge 88 of the back collection film 84 and emits light, which is redirected towards the display 82" via the light-turning features 94 in order to illuminate the display device 85.

Figure 20:
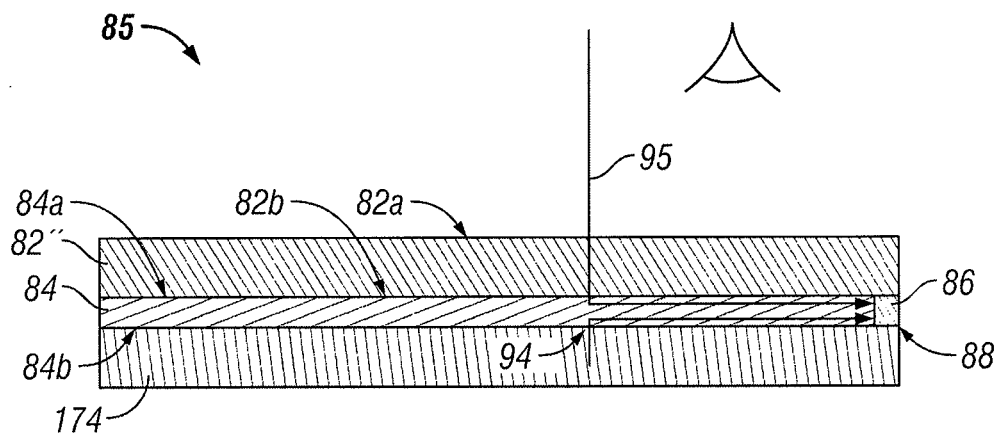
FIG. 20 is a schematic cross-section of another embodiment of an emissive display device having a collection film between the active display pixels and backlight.

FIG. 20 illustrates a back collection film 84 disposed between the emissive display 82" and a back light 174 for the emissive display 82". Ambient light 95 passes through the display 82" to be received by the front collection film surface 84a of the back collection film 84 and is redirected via the light-turning features 94 to the edge 88 of the back collection film 84, to be converted into electrical energy by the photovoltaic device 86. The back light 174 emits light, which is received by the back collection film surface 84b of the back collection film 84, where it is also redirected by the light-turning features 94 to the edge 88 of the back collection film 84 to be converted into electrical energy by the photovoltaic device 86 (or by a different PV device on a different edge). The back light 174 also directs light through the display 82" to illuminate the display device 85. Placing the collection film 84 between the emissive display 82" and the back light 174 and aligning the light-turning features with the inactive regions of the display device 85 can replace a black mask on the display pixels 161 as ambient light 95 and the emitted light is shunted to the photovoltaic device 86 at the edge of the collection film 84 to be converted into electrical energy, reducing light reflected or transmitted to the viewer from the inactive regions. The function of a black mask in reducing wash-out (i.e., increasing contrast for active pixels) can be met by the collection film while generating power, and omitting the steps of creating the black mask. As discussed previously, elimination of the black mask can reduce overall processing cost and manufacturing time.

Figure 21:
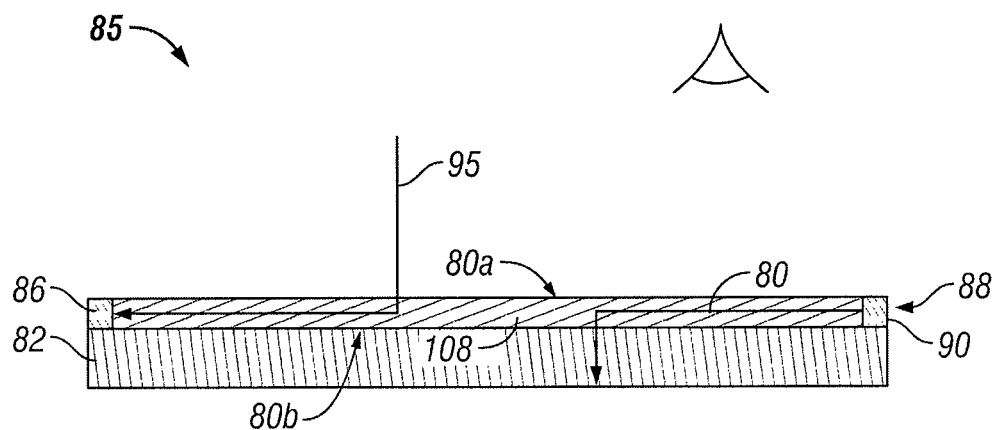
FIG. 21 is a schematic cross-section of another embodiment of an emissive display device having a collection film with asymmetric turning features.

FIG. 21 illustrates an embodiment having a front collection film 80 disposed over a reflective display 82. As illustrated in this embodiment, the front collection film 80 comprises the asymmetric light-turning features 108, such as those of FIG. 11C. Ambient light 95 is received by the front collection film surface 80a of the front collection film 80 and is redirected by the light turning features 108 to one edge 88 of the collection film 80 to be converted into electrical energy by the photovoltaic device 86. A light source 90 is positioned at another, opposite edge of the front collection film 80 and emits light, which is redirected by the light turning features 108 toward the display 82 in order to illuminate the display device 85.

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than fabrication of semiconductor devices.

What is claimed is:

1. A display device comprising:
   an active array of reflective display pixels incorporating microelectromechanical systems (MEMS) devices having a front display surface for displaying an image and a back display surface opposite the front display surface;
   at least one collection film in front of the front display surface, the collection film having a front collection film surface, a back collection film surface, at least one edge, and a plurality of light-turning features, wherein the light-turning features are configured to redirect light between the front or back collection film surface and an edge of the collection film;
   a power supply for powering an electrical device; and
   a photovoltaic device disposed on the edge of the collection film and configured to receive ambient light laterally transmitted from the light-turning features through the collection film surface and to convert the received ambient light to electric energy for generating and supplying power to the power supply.

2. The display device of claim 1, wherein the light source is disposed on the same edge as the photovoltaic device.

3. The display device of claim 1, wherein the light source is disposed at a different location from the photovoltaic device.

4. The display device of claim 1, wherein the collection film comprises a thin film having a thickness between about 0.5 mm to 10 mm.

5. The display device of claim 1, further comprising a plurality of collection films disposed in a stack structure, each collection film having a front collection film surface, a back collection film surface, at least one edge, and a plurality of light-turning features, wherein the light-turning features are configured to redirect light between the front or back collection film surface and an edge of the collection film.

6. The display device of claim 1, wherein the light-turning features comprise diffractive features.

7. The display device of claim 1, wherein the light-turning features comprise holographic features.

8. The display device of claim 1, wherein the MEMS devices are interferometric modulators (IMODs).

9. The display device of claim 1, wherein a second collection film is disposed behind the back display surface.

10. The display device of claim 1, wherein the photovoltaic device is sensitive to at least one of: ultraviolet light and infrared light.

11. The display device of claim 1, wherein the collection film is transparent to at least one of: ultraviolet light and infrared light.

12. The display device of claim 11, wherein the collection film is configured to redirect at least one of the incident ultraviolet light and the incident infrared light.

13. The display device of claim 1, further comprising a light source disposed on an edge of the collection film.

14. The display device of claim 13, wherein the light source comprises a light-emitting diode (LED).

15. The display device of claim 1, wherein the light-turning features of the collection film comprise prismatic features.

16. The display device of claim 15, wherein the prismatic features are symmetrical.

17. The display device of claim 15, wherein the prismatic features are asymmetrical.

18. The display device of claim 17, wherein the prismatic features comprise slits.

19. The display device of claim 17, wherein
   the photovoltaic device and a light source are disposed on opposite edges of the collection film and the asymmetric prismatic features of the collection film are configured to redirect ambient light from the front collection film surface to the photovoltaic device and to redirect emitted light from the light source to the back collection film surface to illuminate the front display surface.

20. The display device of claim 1, wherein ambient light can pass through at least one inactive region between active pixel regions of the array.

21. The display device of claim 20, wherein the pixels of the active array of display pixels are transflective, wherein a portion of ambient light passes through active pixel regions to reach the collection film.

22. The display device of claim 20, wherein the inactive region comprises areas between pixels.

23. The display device of claim 20, wherein a percentage of about 5% to about 50% of visible light is allowed to pass through the active array of display pixels.

24. The display device of claim 23, wherein the pixels of the active array of display pixels employ backlit reflective technologies.

25. A display device comprising:
   an array of display pixels having a front display surface for displaying an image and a back surface;
   at least one collection film disposed over the front of the front display surface, the collection film having a plurality of light-turning features, wherein the light-turning features are configured to redirect light between a front or back collection film surface and edges of the collection film;
   a power supply for powering an electrical device;
   at least one photovoltaic device disposed at a first edge of the collection film, wherein the at least one photovoltaic device is configured to receive incident ambient light turned by the light-turning features of the collection film and to convert the received ambient light to electric energy for generating and supplying power to the power supply; and
   at least one light source disposed at a second edge, wherein the light source emits light laterally through the collection film to be turned by the light-turning features toward the array of display pixels.

26. The display device of claim 25, wherein the collection film is transparent to at least one of: ultraviolet light and infrared light.

27. The display device of claim 26, wherein the collection film is configured to redirect at least one of the incident ultraviolet light and the incident infrared light.

28. The display device of claim 25, wherein the photovoltaic device is sensitive to at least one of: ultraviolet light and infrared light.

29. A display device comprising:
- a display means for displaying and altering images, the display means having a front display surface;
- a light-converting means for generating electric energy from incident ambient light and supplying power from the generated electric energy to an electrical device; and
- a light-turning means for turning the ambient light from a direction incident on the front display surface to a lateral direction along the front display surface toward the light-converting means, wherein the light-turning means is formed on the front display surface of the display means, wherein the light-turning means is transparent to at least one of: ultraviolet light and infrared light.

30. The display device of claim 29, further comprising an emitting means for emitting light.

31. The display device of claim 29, wherein the light-converting means comprises a photovoltaic device.

32. The display device of claim 29, wherein the light-turning means comprises a collection film having a front collection film surface, a back collection film surface, and a plurality of light-turning features, wherein the light-turning features are configured to redirect light between the front or back collection film surface and an edge of the collection film.

33. The display device of claim 29, wherein the light-turning means is configured to redirect at least one of: incident ultraviolet light and incident infrared light.

34. The display device of claim 29, wherein the light-converting means is sensitive to at least one of: ultraviolet light and infrared light.

* * * * *